(12) United States Patent
Kinugawa et al.

(10) Patent No.: US 6,847,231 B2
(45) Date of Patent: Jan. 25, 2005

(54) OUTPUT CIRCUIT

(75) Inventors: Hiroki Kinugawa, Shiga (JP); Yoshinori Ishikawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/373,857

(22) Filed: Feb. 27, 2003

(65) Prior Publication Data

US 2003/0169072 A1 Sep. 11, 2003

(30) Foreign Application Priority Data

Mar. 7, 2002 (JP) ........................................ 2002-062036

(51) Int. Cl.⁷ .............................................. H03K 19/175
(52) U.S. Cl. ............................. 326/82; 326/83; 326/31; 327/534; 327/156; 323/271; 323/282
(58) Field of Search ............................. 326/31, 82, 83; 327/156, 538, 543; 523/271, 273, 274, 282

(56) References Cited

U.S. PATENT DOCUMENTS 6,064,243 A * 5/2000 Matsuda et al. ............ 327/156
6,429,635 B2 * 8/2002 Okubo ........................ 323/282
6,489,833 B1 * 12/2002 Miyazaki et al. ........... 327/534

FOREIGN PATENT DOCUMENTS

| JP | 04-167813 | 6/1992 |
| JP | P2000-252803 A | 9/2000 |
| JP | P2000-299626 A | 10/2000 |

* cited by examiner

Primary Examiner—Vibol Tan
(74) Attorney, Agent, or Firm—McDermott Will & Emery LLP

(57) ABSTRACT

An output circuit includes: a power supply unit; an output MIS transistor connected to the power supply unit; a reference MIS transistor that is connected to the power supply unit and is invariably in ON state; a current supply unit for generating a reference voltage Vref; an output terminal through which a current is supplied to a load circuit; a comparator; a logic circuit; and a control circuit for carrying out the ON/OFF control of the output MIS transistor. Comparison is made between the reference voltage Vref and output terminal voltage Vout by utilizing the ON-state resistances of the output and reference MIS transistors, thus detecting the magnitude of an output current. If the output current exceeds the target value, the output MIS transistor is turned OFF, thereby protecting it from an excessive current.

19 Claims, 12 Drawing Sheets

Output of control circuit 14

Output terminal voltage and reference voltage

Waveform of current flowing through coil 3

Output of comparator 10

Output of logic circuit 17

Output of timer circuit 11

Output of pulse generator 30

Output terminal voltage and reference voltage

Waveform of current flowing through coil 3

Output of comparator 10

Output of edge detection circuit 29

T0 T1 T2 T3 T4

Output of control circuit 114

Detection voltage and reference voltage

Waveform of current flowing through coil 103

Output of comparator 110

Output of timer circuit 111

OUTPUT CIRCUIT

BACKGROUND OF THE INVENTION

The present invention relates to output circuits, and more particularly relates to output circuits for driving coil loads, such as switching power supplies and motor drivers.

With recent improvements in digital circuit technology, power supplies and motor drivers are digitally controlled to reduce power consumption of the entire device. In accordance with this trend, in the output circuits such as switching power supplies and motor drivers, MIS (Metal Insulator Semiconductor) transistors are brought into use in order to control the supply of current to load circuits.

The output circuit of this type is normally provided with a control circuit for carrying out control so that the value of voltage to be supplied to a load circuit is kept constant. If an output terminal of the output circuit is short-circuited to the ground, the control circuit carries out control to increase the current supplied from a power supply unit to the output terminal, and to prevent a reduction in an output terminal voltage. In such a case, the current allowed to flow through an output MIS transistor becomes an excessive current the value of which exceeds a set value. This is the factor that causes damage to the output MIS transistor. Such a phenomenon also occurs when the resistance of the load circuit is reduced (i.e., when the output circuit is overloaded), or when an excessive charge current from an output capacitor is allowed to flow upon activation.

The output circuit is therefore provided with the function of limiting output current in order to ensure the protection of the output MIS transistor against the excessive current. To limit the output current, the output current flowing from an output circuit has to be detected. For this purpose, a frequently used method for detecting the output current is to detect the output current by using a resistor provided in a path through which current flows.

Hereinafter, the above-described conventional output circuit will be described with reference to the accompanying drawings.

FIG. 11 is a circuit diagram showing the configuration of the conventional output circuit.

As shown in FIG. 11, the conventional output circuit includes: a power supply unit 101 for supplying the output circuit with a voltage; an output terminal 105 through which power is supplied to an external load circuit 102; a first resistor 107; an intermediate node 115; an output MIS transistor 106 that is a p-channel MIS transistor; a current supply unit 109 with one end thereof connected to the ground and the other end thereof connected to the power supply unit 101; a reference node 116; a second resistor 108 for generating a reference voltage; a comparator 110 with one input section thereof connected to the reference node 116 and the other input section thereof connected to the intermediate node 115; and a control circuit 114 connected to the output section of the comparator 110, the power supply unit 101, and a gate electrode of the output MIS transistor 106. The first resistor 107, the intermediate node 115 and the output MIS transistor 106 are provided between the power supply unit 101 and the output terminal 105 in this order. And the reference node 116 and the second resistor 108 are provided between the current supply unit 109 and the power supply unit 101 in this order. In this configuration, the output MIS transistor 106 allows or stops the supply of power to the output terminal 105.

The control circuit 114 includes: a timer circuit 111 to which an output signal from the comparator 110 is inputted; a driving circuit 112; and a switching circuit 113, which is controlled by an output signal from the timer circuit 111, for selecting either the voltage of the power supply unit 101 or the output signal of the driving circuit 112 to input the selected voltage or output signal to the gate electrode of the output MIS transistor 106.

The output terminal 105 is connected to the load circuit 102 including a resistor, a capacitor and so on. Between the output terminal 105 and the load circuit 102, a node 117 and a coil 103 for generating electromagnetic energy are provided in this order. In addition, the node 117 is connected to the output terminal of a diode 104 the input terminal of which is connected to the ground. It is to be noted that "load circuit 102" is a generic name for various kinds of circuits (e.g., a motor circuit and so forth). The load circuit 102, the coil 103 and the diode 104 are normally provided outside the output circuit.

In the conventional output circuit, the first resistor 107 is provided in order to monitor the current outputted through the output terminal 105 when the output MIS transistor 106 is brought into conduction. Therefore, the output MIS transistor 106 can be controlled to turn OFF when the voltage applied to the intermediate node 115 is lower than the reference voltage, thus preventing an excessive current from flowing through the output MIS transistor 106 and into the load circuit 102.

Next, the operation of the conventional output circuit will be briefly described.

As shown in FIG. 11, when the output MIS transistor 106 is ON, a voltage supplied from the power supply unit 101 is fed to the output terminal 105 via the first resistor 107 and the output MIS transistor 106 and is outputted as an output terminal voltage Vout from the output terminal 105. In this case, the coil 103 accumulates electromagnetic energy, and although not shown, a capacitor provided in the load circuit 102 accumulates electrical charge.

On the other hand, when the output MIS transistor 106 is OFF, the supply of voltage through the output terminal 105 is stopped, and the energy accumulated in the coil 103 is released. More specifically, when the output MIS transistor 106 is OFF, the diode 104 is brought into conduction to carry out a regenerative operation, and the load circuit 102 including a capacitor smoothes the energy released from the coil 103, so that the energy is supplied, as a DC voltage, to a DC output terminal VDC. As used herein, "regenerative operation" means the operation of allowing the release of energy from the coil.

The ON/OFF states of the output MIS transistor 106 is controlled by a control voltage VG fed from the control circuit 114, and the output MIS transistor 106 is turned ON when the control voltage VG is at a low level. During the normal operation of the output circuit, the driving circuit that includes, although not shown, a circuit for generating a PWM signal is used to carry out the ON/OFF control of the output MIS transistor 106.

Furthermore, when the output MIS transistor 106 is in ON state, the output current is detected as a detection voltage VM that is the voltage applied to the intermediate node 115. More specifically, the second resistor 108 and the current supplied from the current supply unit 109 are used to generate a reference voltage Vref that is the voltage applied to the reference node 116, and the level of the reference voltage Vref is compared with that of the detection voltage VM by the comparator 110, thus carrying out the detection of the output current.

Next, a current detection method using the conventional output circuit will be described in detail with reference to FIGS. 11 and 12.

FIGS. 12(a) through 12(e) are timing charts each showing the waveform of voltage or current of each component provided in the conventional output circuit. In the charts, the abscissa represents time t, and the waveform of each component in operation is shown.

First, FIG. 12(a) shows the waveform of the control voltage VG fed from the control circuit 114. In this prior-art example, since the output MIS transistor 106 is a p-channel MIS transistor, the time period over which the control voltage VG is at a low level corresponds to the time period over which the output MIS transistor 106 is ON, while the time period over which the control voltage VG is at a high level corresponds to the time period over which the output MIS transistor 106 is OFF. It should be noted that at the time of T0, the gate electrode of the output MIS transistor 106 is connected to the driving circuit 112 in the control circuit 114.

In FIG. 12(b), the reference voltage Vref is indicated by the alternate long and short dashed line, and the detection voltage VM, i.e., the voltage applied to the intermediate node 115, is indicated by the solid line. In the chart, the reference voltage Vref substantially remains constant because the reference voltage Vref is determined by the second resistor 108 and the current value of the current supply unit 109. Therefore, the reference voltage Vref is set at a value corresponding to the boundary value between the normal level and the excessive level of the output current.

Furthermore, since no current flows through the first resistor 107 when the output MIS transistor 106 is OFF, the detection voltage VM becomes equal to a supply voltage Vcc of the power supply unit 101. However, when the output MIS transistor 106 is turned ON, a voltage drop is caused by the first resistor 107, and thus the detection voltage VM becomes smaller than the supply voltage Vcc. In addition, the detection voltage VM varies in accordance with the magnitude of the output current, and if the magnitude of the output current is increased, a reduction in the detection voltage VM is roughly proportional to the magnitude of the output current.

FIG. 12(c) is shows the waveform of the current flowing through the coil 103. It should be noted that although the current waveform shown in FIG. 12(c) reaches the target value soon after the output circuit has been operated for the sake of simplicity, a rise in the current waveform is a little bit more gradual in reality, and the output MIS transistor 106 has to be turned ON/OFF several times before the current waveform reaches the target value.

As shown in FIG. 12(c), the coil 103 serves as a load on the output MIS transistor 106 in this prior-art example; therefore, even if the output MIS transistor 106 is completely ON upon switching of the transistor 106 at the time of T0, the impedance of the coil 103 momentarily becomes large due to the effect of the counter-electromotive force of the coil 103, and thus the current flowing through the coil 103 does not quickly increase. Accordingly, the detection voltage VM is, at first, approximately equal to the supply voltage Vcc in FIG. 12(b). When electromagnetic energy is accumulated in the coil 103 with the passage of time, the impedance of the coil 103 is reduced correspondingly to increase an output current Io, thus gradually reducing the detection voltage VM. As the detection voltage VM is reduced, the current flowing through the coil 103 is conversely increased.

Next, when the output MIS transistor 106 is turned OFF at the time of T1, the detection voltage VM becomes equal to the supply voltage Vcc of the power supply unit 101. During the time period over which the output MIS transistor 106 is OFF (i.e., during the T1-to-T2 period), the diode 104 is brought into conduction to carry out a regenerative operation, thus releasing the energy accumulated up to this time in the coil 103. The current flowing through the coil 103 is reduced continuously from the time T1 (see FIG. 12(c)).

Then, suppose that the output MIS transistor 106 is turned ON again at the time of T2. In such a case, if all the energy accumulated in the coil 103 is not released during the time period over which the output MIS transistor 106 is OFF, the detection voltage VM does not begin to decrease from the value corresponding to the supply voltage Vcc but begins to decrease from the value that is a little smaller than the supply voltage Vcc of the power supply unit 101 as shown in FIG. 12(b). Then, electromagnetic energy is accumulated in the coil 103 again, and the detection voltage VM is gradually reduced with the passage of time. In this manner, the output MIS transistor 106 is turned ON/OFF in accordance with the control voltage VG. The operations carried out during the T3-to-T5 period will be described later.

FIG. 12(d) shows the waveform of the output voltage from the comparator 110. As shown in FIG. 12(d), the comparator 110 makes a comparison between the detection voltage VM and the reference voltage Vref to output a high-level signal when the detection voltage VM is smaller than the reference voltage Vref, and output a low-level signal when the detection voltage VM is greater than the reference voltage Vref.

FIG. 12(e) shows the waveform of the output voltage from the timer circuit 111. As shown in FIG. 12(e), the timer circuit 111 operates in response to the rising edge of the waveform of the output voltage from the comparator 110, and outputs a high-level signal for a given period of time by a time constant circuit (not shown) provided in the timer circuit 111.

Described in detail below are the operations, which are carried out during the T3-to-T5 period, for preventing the output of an excessive current by detecting the output current.

If the control voltage VG is continuously at a low level from the time T2, the detection voltage VM is gradually reduced, and becomes smaller than the reference voltage Vref in due time. In this case, the current flowing through the coil 103 is exceeding the target value shown in FIG. 12(c). Accordingly, the comparator 110 outputs a high-level signal to the timer circuit 111, and the timer circuit 111 operates to output a high-level signal.

Once the timer circuit 111 has started outputting a high-level signal, the timer circuit 111 keeps on outputting a high-level signal for a given period of time. Accordingly, during the T3-to-T5 period, the switching circuit 113 blocks an output signal from the driving circuit 112 and is switched such that the potential of the power supply unit 101 is fed to the gate electrode of the output MIS transistor 106. Thus, the control voltage VG to be applied to the output MIS transistor 106 is forcefully placed at a high level. Consequently, the output MIS transistor 106 is OFF for a period of time determined by the operation of the timer circuit 111, thereby preventing power consumption in the output MIS transistor 106 and protecting the output MIS transistor 106 from the excessive current.

When the output MIS transistor 106 is turned OFF, the detection voltage VM exceeds the reference voltage Vref once more, and thus the output of the comparator is at a low level again.

It is to be noted that the waveform of the high-level output of the comparator 110 is a differential pulse-like waveform because there exist a response time i) required for the output of the timer circuit 111 to be at a high level, a response time ii) required for the output of the switching circuit 113 to be at a high level after the timer circuit 111 has outputted a high-level signal, and a response time iii) required for the output MIS transistor 106 to be turned OFF. That is, the pulse width of the high-level output of the comparator 110 is determined by the sum of the response time i), the response time ii) and the response time iii).

In the conventional output circuit, the output MIS transistor is protected from the excessive current by carrying out the above-described operations.

The conventional output circuit, however, presents the following problems. First, the first resistor 107 is inserted between the output MIS transistor 106 and the power supply unit 101; therefore, a voltage drop is caused by the first resistor 107 to create the problem that the range of the voltage usable for the load circuit is limited. The adverse effect of the voltage drop is particularly serious when a relatively low voltage power supply such as a dry battery is used. Even if other power supplies are used, it is necessary to set the supply voltage, in the light of the voltage drop caused by the first resistor 107, at a value greater than the voltage needed for the driving of the load circuit.

In addition, since a resistor causes a power loss of $RI^2$ (R represents a resistance value, and I represents a current value), the conventional output circuit consumes a great deal of power, and thus requires superfluous power.

Furthermore, the conventionally configured output circuit using the first resistor 107 does not lend itself to the integration on a chip. Specifically, this problem is caused by the following reasons. The excessive current in question is at a level corresponding to a current value of about 1A; therefore, the first resistor 107 having a resistance value of 1Ω or less, for example, is required. However, if the first resistor 107 is formed of a material having a sheet resistance of more than 100Ω/□, the area of the first resistor 107 becomes too large, which makes it difficult to integrate the conventional output circuit on a chip.

SUMMARY OF THE INVENTION

It is therefore an object of the present invention to provide an output circuit that can solve the above-described problems, that protects an output MIS transistor from an excessive current, and that utilizes power with a high degree of efficiency.

A first output circuit of the present invention includes: an output node through which power is supplied to an external load circuit; a first power supply unit; an output MIS transistor, provided between the first power supply unit and the output node, for allowing or stopping the supply of the power to the output node; a current supply unit; a reference node connected to the current supply unit; a reference MIS transistor that is provided between the first power supply unit and the reference node, and that has a gate electrode to which a constant voltage is applied to allow the reference MIS transistor to function as a resistor; a comparator having one input section thereof connected to the reference node and the other input section thereof connected to the output node; and a control circuit, connected to the output section of the comparator, for carrying out the ON/OFF control of the output MIS transistor so as to turn the output MIS transistor OFF for a given period of time at least when the potential of the output node is lower than that of the reference node.

Thus, an output current can be detected by making a comparison between the potential of the output node and that of the reference node, even if no resistor used for the detection of the current is provided between the output MIS transistor and the first power supply unit. Since the current exceeding a set value is prevented from flowing through the output MIS transistor, the output MIS transistor can be protected from an excessive current. Furthermore, since no resistor for current detection is provided, the power loss of the inventive output circuit is lower than that of the conventional output circuit, and the power consumption of the apparatus provided with the inventive output circuit can be reduced. In addition, since a resistor for current detection which increases the size of the output circuit does not have to be provided, the area of the output circuit can be reduced, and thus the entire output circuit can be integrated on a chip with other circuits.

No resistor used for the monitoring of an output current outputted from the output node may be provided between the first power supply unit and the output MIS transistor. In such an embodiment, the output circuit can be reduced in power loss and area as described above.

Each of the output and reference MIS transistors may be a p-channel MIS transistor having a gate electrode. In such an embodiment, the circuit configuration of the first output circuit can be simplified compared with an output circuit that uses an n-channel transistor. Accordingly, the area of the first output circuit can be reduced.

The control circuit may include: a driving circuit that is operated by the power supplied from the first power supply unit; and a switching circuit for carrying out, in response to an output signal from the comparator, a switching operation to block an output signal from the driving circuit or to allow the output signal to be inputted to a gate electrode of the output MIS transistor. In such an embodiment, the above-described ON/OFF control of the output MIS transistor can be carried out in a relatively simple configuration.

When the potential of the output node is higher than that of the reference node, the switching circuit may carry out a switching operation to allow an output signal from the driving circuit to be inputted to the gate electrode of the output MIS transistor, and when the potential of the output node is lower than that of the reference node, the switching circuit may carry out a switching operation to allow a voltage of the first power supply unit to be applied to the gate electrode of the output MIS transistor for a given period of time. In such an embodiment, it is possible to detect the output current and to prevent the current exceeding the set value from flowing through the output MIS transistor.

In another embodiment, the control circuit may include: a pulse generator; and a latch circuit that is reset in response to an output signal from the comparator, and that is set in response to an output signal from the pulse generator, wherein the output MIS transistor is controlled to turn ON/OFF in response to an output signal from the latch circuit. In such an embodiment, it is possible to carry out the ON/OFF control of the output MIS transistor which has difficulty in being affected by a noise resulting from electromagnetic induction caused by a coil, for example, compared with the case where a switching circuit is used.

In particular, the latch circuit may be an SR flip-flop. In such an embodiment, it is possible to carry out, in a simple configuration, the ON/OFF control of the output MIS transistor which has difficulty in being affected by the noise.

In the first output circuit, each of the output and reference MIS transistors may be an n-channel MIS transistor having a gate electrode, and the output circuit may further include a second power supply unit for applying a voltage higher than that of the first power supply unit to at least the gate electrode of the reference MIS transistor. In such an embodiment, the output and reference MIS transistors can be turned ON completely, and the output current can be detected by utilizing the ON-state resistances of the transistors in the same way as in the case where p-channel MIS transistors are used. This limits the output current so that it will not exceed the set value. Since the current driving-capability of an n-channel MIS transistor is higher than that of a p-channel MIS transistor, the output current of the output circuit using an n-channel MIS transistor can be greater than that of the output circuit using a p-channel MIS transistor.

The second power supply unit may include a booster circuit. In such an embodiment, for example, the voltage supplied from the first power supply unit can be increased by the second power supply unit, thus supplying the increased voltage to the gate electrode of the reference MIS transistor. As a result, it is possible to realize the output circuit that has n-channel MIS transistors and uses a common power source for the first and second power supply units.

The booster circuit may be a bootstrap circuit or a charge pump circuit. In such an embodiment, it is possible to easily realize the output circuit that has n-channel MIS transistors and uses a common power source for the first and second power supply units.

In still another embodiment, the control circuit may include: a driving circuit that is operated by the power supplied from the second power supply unit; and a switching circuit for carrying out, in response to an output signal from the comparator, a switching operation to block an output signal from the driving circuit or to allow an output signal from the driving circuit to be inputted to the gate electrode of the output MIS transistor. In such an embodiment, the above-described ON/OFF control of the output MIS transistor can be carried out in a relatively simple configuration.

When the potential of the output node is lower than that of the reference node, a ground potential may be applied to the gate electrode of the output MIS transistor for a given period of time. In such an embodiment, it is possible to detect the output current and to prevent the current exceeding the set value from flowing through the output MIS transistor.

In still yet another embodiment, the control circuit may include: a pulse generator; and a latch circuit that is reset in response to an output signal from the comparator, and that is set in response to an output signal from the pulse generator, wherein the output MIS transistor is controlled to turn ON/OFF in response to an output signal from the latch circuit. In such an embodiment, it is possible to carry out the ON/OFF control of the output MIS transistor which has difficulty in being affected by the noise, compared with the case where a timer circuit is used.

The latch circuit may be an SR flip-flop. In such an embodiment, it is possible to carry out, in a simple configuration, the ON/OFF control of the output MIS transistor which has difficulty in being affected by the noise.

In the first output circuit, a plurality of the reference MIS transistors may be provided and connected to each other in series. In such an embodiment, the ratio between the ON-state resistance of the reference MIS transistors and that of the output MIS transistor can be adjusted by changing the number of the reference MIS transistors to be provided. Therefore, not only the level of the output current to be detected can be adjusted but also a bias current can be reduced in accordance with the number of the reference MIS transistors to be connected in series. Furthermore, the output current can be accurately detected to limit the value of the output current flowing through the output MIS transistor while the ratio between the ON-state resistance of the reference MIS transistors and that of the output MIS transistor can be ensured. As a result, the output MIS transistor can be protected from the excessive current.

In the first output circuit, both the output MIS transistor and the reference MIS transistor may be integrated on a single chip. In such an embodiment, the area of the output circuit can be reduced, and the electric characteristics of the output and reference MIS transistors can be made uniform by performing a common manufacturing process. Therefore, for example, the gate width of each MIS transistor can be adjusted, thereby adjusting the ratio between the ON-state resistance of the reference MIS transistor and that of the output MIS transistor. Consequently, a fine adjustment can be made to the limit for the output current. Besides, for example, by making the gate width of the output MIS transistor larger than that of the reference MIS transistor, the bias current flowing through the reference MIS transistor can be made smaller than the output current, thus further reducing the power consumption.

A second output circuit of the present invention includes: an output node through which power is supplied to an external load circuit; a first power supply unit; an output MIS transistor, provided between the first power supply unit and the output node, for allowing or stopping the supply of the power to the output node; a current supply unit; a reference node connected to the current supply unit; a reference MIS transistor that is provided between the first power supply unit and the reference node, and that has a gate electrode to which a constant voltage is applied to allow the reference MIS transistor to function as a resistor; a comparator having one input section thereof connected to the reference node and the other input section thereof connected to the output node; and a control circuit, connected to the output section of the comparator, for carrying out the ON/OFF control of the output MIS transistor so as to turn the output MIS transistor OFF for a given period of time at least when the potential of the output node is lower than that of the reference node, wherein both the output MIS transistor and the reference MIS transistor are integrated on a single chip.

Thus, the current exceeding the set value can be prevented from flowing through the output MIS transistor by making a comparison between the potential of the output node and that of the reference node, even if no resistor for current detection is provided between the output MIS transistor and the first power supply unit. Therefore, the output MIS transistor can be protected from the excessive current. Furthermore, since the power loss can be reduced and heat generation can be prevented unlike the conventional output circuit, the apparatus provided with the inventive output circuit realizes lower power consumption and operates with stability. In addition, since the output and reference MIS transistors are to be integrated on a single chip, the electric characteristics of the output and reference MIS transistors can be made uniform by performing a common manufacturing process. As a result, the value of the output current can be limited accurately.

In the second output circuit, the gate width of the output MIS transistor may be larger than that of the reference MIS transistor. In such an embodiment, the bias current flowing through the reference MIS transistor can be made smaller than the output current. Accordingly, the power consumption of the output circuit can be further reduced.

The second output circuit may further include a second power supply unit for supplying a voltage higher than that of the first power supply unit to the gate electrode of the reference MIS transistor. In such an embodiment, the output and reference MIS transistors can be each formed by an n-channel transistor. As a result, the output circuit that provides a large output current is realized.

DESCRIPTION OF THE PREFERRED EMBODIMENTS (First Embodiment)

Figure 1:
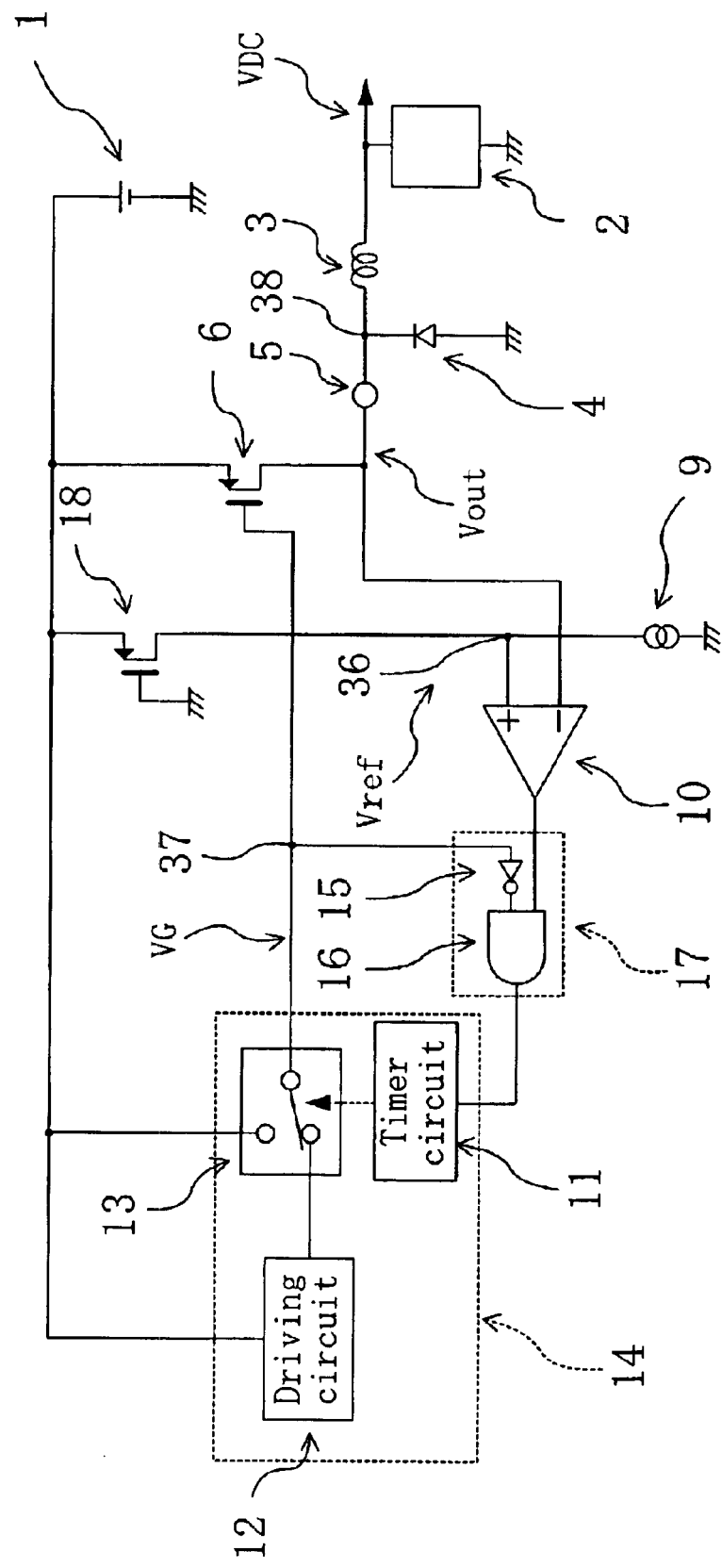
FIG. 1 is a circuit diagram showing the configuration of an output circuit according to a first embodiment of the present invention.

FIG. 1 is a circuit diagram showing the configuration of an output circuit according to a first embodiment of the present invention. The output circuit according to the first embodiment is provided with a p-channel MIS transistor as an output MIS transistor 6. As can be seen from FIG. 1, the output circuit of the first embodiment is greatly different from the conventional output circuit in that no resistor is provided between the output MIS transistor 6 and a power supply unit 1, and that instead of the second resistor 108 for generating a reference voltage, a reference MIS transistor 18 is provided.

As shown in FIG. 1, the output circuit of the first embodiment includes: the power supply unit 1 for supplying the output circuit with a voltage; an output terminal 5 which is connected to the power supply unit 1 and through which power is supplied to an external load circuit 2; the output MIS transistor 6 that is a p-channel MIS transistor provided between the power supply unit 1 and the output terminal 5; a current supply unit 9 with one end thereof connected to the ground and the other end thereof connected to the power supply unit 1; a reference node 36; a reference MIS transistor 18 that is a p-channel MIS transistor; a comparator 10 with one input section thereof connected to the reference node 36 and the other input section thereof connected to the output terminal 5; a logic circuit 17 an input section of which is connected, at one end thereof, with the output section of the comparator 10; a control circuit 14, which is connected to the output section of the logic circuit 17, the power supply unit 1, and a gate electrode of the output MIS transistor 6, for carrying out the ON/OFF control of the output MIS transistor 6; and a second node 37 provided between the control circuit 14 and the gate electrode of the output MIS transistor 6. The reference node 36 and the reference MIS transistor 18 are provided between the current supply unit 9 and the power supply unit 1 in this order. In this embodiment, like the conventional output circuit, the output MIS transistor 6 allows or stops the supply of voltage to the output terminal 5. Further, the reference MIS transistor 18 is invariably in ON state since its gate electrode is connected to the ground, and the voltage generated at the reference node 36 (i.e., a reference voltage Vref) is held constant due to a constant bias current supplied from the current supply unit 9 and an ON-state resistance of the reference MIS transistor 18.

Furthermore, in the first embodiment, the logic circuit 17 includes: an inverter 15 the input section of which is connected to the second node 37; and an AND circuit 16 having one input section to which an output signal from the comparator 10 is inputted and the other input section to which an output signal from the inverter 15 is inputted.

The control circuit 14 includes: a timer circuit 11 to which an output signal from the AND circuit 16 is inputted; a driving circuit 12 that is operated by the power supplied from the power supply unit 1; and a switching circuit 13 for carrying out, in response to a signal from the timer circuit 11, a switching operation to block an output signal from the driving circuit 12 or to allow the output signal to be inputted to the gate electrode of the output MIS transistor 6. In this embodiment, the timer circuit 11 detects the rising edge of an output signal from the AND circuit 16, and outputs a high-level signal for a given period of time. As the timer circuit 11, a one-shot multivibrator or a digital circuit for counting periodic clock signals to measure the length of time is preferably used.

Further, in the output circuit of the first embodiment, the output MIS transistor 6 is of the same conductivity type as the reference MIS transistor 18, thus making it possible to integrate the output and reference MIS transistors 6 and 18 on a single chip. Accordingly, it is possible to integrate the entire output circuit on a single chip with other circuits.

Furthermore, the output terminal 5 is connected to the load circuit 2 including a resistor, a capacitor and so on. Between the output terminal 5 and the load circuit 2, a first node 38 located closer to the load circuit 2 and a coil 3 for generating electromagnetic energy are provided in this order. The first node 38 is connected to the output terminal of a diode 4 the input terminal of which is connected to the ground. It is to be noted that "load circuit 2" is a generic name for various kinds of circuits (e.g., a motor circuit and so forth), and refers to a circuit that includes a capacitor and that is driven by an electrical signal. The load circuit 2, the coil 3 and the diode 4 are normally provided outside the output circuit. As is often the case, a Schottky diode is preferably used as the diode 4.

As described above, since no resistor is provided between the output MIS transistor 6 and the power supply unit 1, no superfluous power is consumed unlike the conventional output circuit. In addition, since a voltage drop due to a resistor does not occur, the range of the voltage to be supplied to the load circuit 2 can be widened. Besides, since a resistor that covers a large area and is used to detect an excessive current does not have to be provided, the area of the output circuit can be considerably reduced for the integration on a semiconductor chip.

It should be noted that since the MIS transistor of the same conductivity type as the output MIS transistor 6 is used as the reference MIS transistor 18 in the output circuit of the first embodiment, it is possible to integrate the output and reference MIS transistors 6 and 18 on a single chip in a common manufacturing process. Thus, in addition to eliminating characteristic variation caused by different types of elements, it is possible to eliminate the characteristic variation of the elements caused by integrating the elements in different manufacturing processes. Accordingly, the ratio between the ON-state resistance of the output MIS transistor 6 and that of the reference MIS transistor 18 remains almost unchanged even if the voltage or temperature of the power supply unit 1 changes. Moreover, the ON-state resistance of each of the MIS transistors having identical structures is almost inversely proportional to the gate width thereof.

In the first embodiment, since the current supplied from the current supply unit 9 is preferably minimized with an eye to lower power consumption, the gate width of the output MIS transistor 6 is larger than that of the reference MIS transistor 18. For example, the gate width of the output MIS transistor 6 is one hundred to several thousand times as large as that of the reference MIS transistor 18.

Next, the operation of the output circuit of the first embodiment will be described.

First, as shown in FIG. 1, when the output MIS transistor 6 is ON, a current supplied from the power supply unit 1 is outputted from the output terminal 5 via the output MIS transistor 6. Herein, the voltage applied to the output terminal 5 is defined as an output terminal voltage Vout. When the output MIS transistor 6 is ON, the coil 3 accumulates electromagnetic energy, and a capacitor (not shown) provided in the load circuit 2 accumulates electrical charge.

On the other hand, when the output MIS transistor 6 is OFF, the supply of voltage from the output terminal 5 is stopped, and the energy accumulated in the coil 103 is released. More specifically, the diode 4 is brought into conduction to carry out a regenerative operation, and the load circuit 2 including a capacitor smoothes the energy released from the coil 3, so that the energy is supplied, as a DC voltage, to a DC output terminal VDC.

The ON/OFF states of the output MIS transistor 6 is controlled by a control voltage VG fed from the control circuit 14, and the output MIS transistor 6 is turned ON when the control voltage VG is at a low level. During the normal operation of the output circuit, the driving circuit that includes, although not shown, a circuit for generating a PWM signal, for example, is used to carry out the ON/OFF control of the output MIS transistor 6.

In the output circuit of the first embodiment, the output current when the output MIS transistor 6 is in ON state is detected by comparing the voltage applied to the output terminal 5 (i.e., the output terminal voltage Vout) with the reference voltage Vref. In other words, a constant reference voltage Vref is generated at the reference node 36 by utilizing the ON-state resistance of the reference MIS transistor 18 and the current supplied from the current supply unit 9, and the level of the reference voltage Vref is compared with that of the output terminal voltage Vout by the comparator 10, thus carrying out the detection of the output current. If the output current flowing through the output MIS transistor 6 is increased when the output MIS transistor 6 is ON, the output terminal voltage Vout is reduced in accordance with the magnitude of the output current. Therefore, by detecting the output terminal voltage Vout, the excessive current can be detected. It should be noted that the output terminal voltage Vout varies in accordance with the magnitude of the output current because the ON-state resistance of the output MIS transistor 6 functions as a resistor for current detection.

Current Detection Method

Hereinafter, a current detection method using the output circuit according to the first embodiment will be described in detail with reference to FIGS. 1 and 2.

FIGS. 2(a) through 2(f) are timing charts each showing the waveform of voltage or current of each component provided in the output circuit of the first embodiment. In each of the charts, the abscissa represents time t.

Figure 2A:
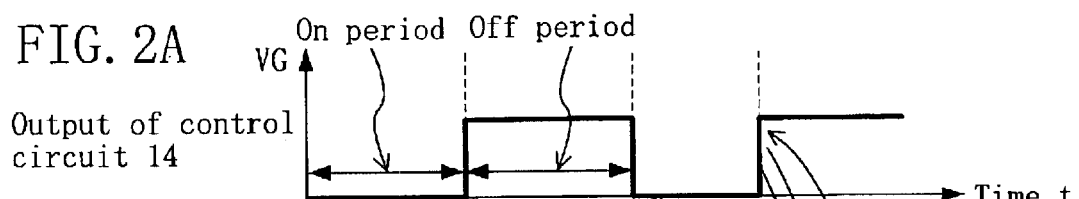
FIGS. 2(a) thorough 2(f) are timing charts each showing the waveform of voltage or current of each component provided in the output circuit of the first embodiment.

First, FIG. 2(a) shows the waveform of the control voltage VG that is fed from the control circuit 14 and is used to control the ON/OFF states of the output MIS transistor 6. In the first embodiment, since the output MIS transistor 6 is a p-channel MIS transistor, the time period over which the control voltage VG is at a low level corresponds to the time period over which the output MIS transistor 6 is ON, while the time period over which the control voltage VG is at a high level corresponds to the time period over which the output MIS transistor 6 is OFF. It should be noted that at the time of T0, the gate electrode of the output MIS transistor 6 inputs an output signal from the driving circuit 12 provided in the control circuit 14.

Figure 2B:
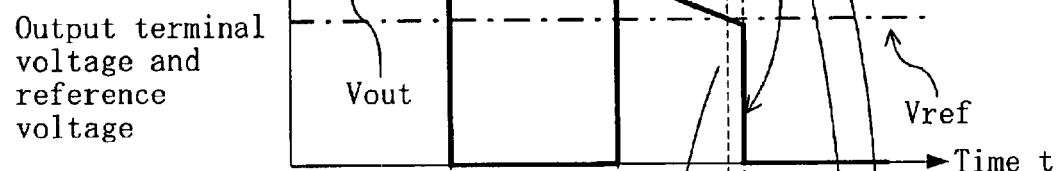
Figure 2C:

Next, FIGS. 2(b) and 2(c) show the waveform of the output terminal voltage Vout and the reference voltage Vref, and the waveform of the current flowing through the coil 3, respectively. In FIG. 2(b), the reference voltage Vref is indicated by the alternate long and short dashed line, and the output terminal voltage Vout of the output terminal 5 is indicated by the solid line. As shown in the chart, the reference voltage Vref is smaller than the supply voltage Vcc by a voltage drop resulting from the ON-state resistance of the reference MIS transistor 18. Furthermore, the output terminal voltage Vout becomes close to the supply voltage Vcc (i.e., the output terminal voltage Vout is at a high level) right after the output MIS transistor 6 is turned ON. On the other hand, the output terminal voltage Vout becomes close to a ground voltage (i.e., the output terminal voltage Vout is at a low level) when the output MIS transistor 6 is turned OFF. When the output terminal voltage Vout is at a high level, the output MIS transistor 6 in ON state exhibits, at its region between the drain and source, the characteristic substantially similar to that of a resistor, and a drop in the output terminal voltage Vout is almost proportional to an increase in the output current.

As shown in FIGS. 2(b) and 2(c), the coil 3 serves as a load on the output MIS transistor 6 in the first embodiment; therefore, even if the output MIS transistor 6 is completely ON upon switching of the transistor 6 at the time of T0, the impedance of the coil 3 is momentarily increased due to the effect of the counter-electromotive force thereof. As a result, virtually no drain current of the output MIS transistor 6 is allowed to flow. In other words, the output terminal voltage Vout is, at first, substantially close to the supply voltage Vcc of the power supply unit 1. When electromagnetic energy is accumulated in the coil 3 with the passage of time, the impedance of the coil 3 is reduced correspondingly to increase an output current Io outputted from the output terminal 5, thus gradually reducing the output terminal voltage Vout.

Then, when the output MIS transistor 6 is turned OFF at the time of T1, the output terminal voltage Vout is at a low level close to a ground voltage. During the time period over which the output MIS transistor 6 is OFF (i.e., during the T1-to-T2 period), the diode 4 is brought into conduction to carry out a regenerative operation, thus releasing the energy accumulated up to this time in the coil 3. The current flowing through the coil 3 is reduced continuously from the time T1.

Next, as shown in FIG. 2(b), when the output MIS transistor 6 is turned ON again at the time of T2, the output terminal voltage Vout is at a high level again. However, if all the energy accumulated in the coil 3 is not released from the coil 3 during the time period over which the output MIS transistor 6 is OFF, the output terminal voltage Vout does not return to the level of the supply voltage Vcc but returns to a voltage level slightly lower than the supply voltage Vcc. Then, the operation of accumulating electromagnetic energy in the coil 3 starts again, and the output terminal voltage Vout is gradually reduced with the passage of time.

Since the energy is still remaining in the coil 3, the current flowing through the coil 3 is decreased not to 0 mA but to a level higher than 0 mA at the time of T2, and the current flowing through the coil 3 is gradually increased therefrom when the output MIS transistor 6 is ON.

As described above, the output MIS transistor 6 is turned ON/OFF in accordance with the control voltage VG. During the T0-to-T3 period, the output MIS transistor 6 is controlled by the driving circuit 12 in the control circuit 14. The operations carried out during the T3-to-T5 period will be described later.

Figure 2D:

FIG. 2(d) shows the waveform of the output voltage from the comparator 10. As shown in FIG. 2(d), the comparator 10 compares the output terminal voltage Vout of the output terminal 5 with the reference voltage Vref to output a high-level signal when the output terminal voltage Vout is smaller than the reference voltage Vref, and output a low-level signal when the output terminal voltage Vout is greater than the reference voltage Vref.

Figure 2E:

FIG. 2(e) shows the waveform of the output voltage from the logic circuit 17. The logic circuit 17 includes the inverter 15 and the AND circuit 16, and as shown in FIG. 2(e), the logic circuit 17 transmits an output signal from the comparator 10 to the output section of the logic circuit 17 when the output MIS transistor 6 is ON, i.e., when the control voltage VG is at a low level. On the other hand, during the time period over which the output MIS transistor 6 is OFF (during the T1-to-T2 period or the period of time after the time T4), i.e., when the control voltage VG is at a high level, the output voltage of the logic circuit 17 is kept at a low level, thus preventing the output signal of the comparator 10 from being transmitted to the output section of the logic circuit 17.

As described above, in the output circuit of the first embodiment, the voltage detected during the time period over which the output MIS transistor 6 is OFF is close to 0V unlike the conventional output circuit. Therefore, the output circuit of the first embodiment is configured so that the output signal of the comparator 10 is transmitted to the output section of the logic circuit 17 only when the output MIS transistor 6 is in ON state.

Figure 2F:
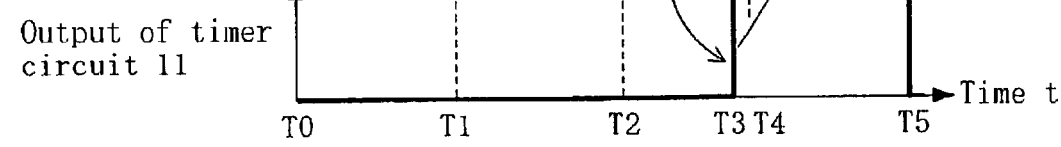

FIG. 2(f) shows the waveform of the output from the timer circuit 11. As shown in FIG. 2(f), the timer circuit 11 operates in response to the rising edge of the waveform of an output voltage from the logic circuit 17, and outputs a high-level signal for a given period of time by a time constant circuit (not shown) provided in the timer circuit 11. It should be noted that although a one-shot multivibrator is used as the timer circuit 11 in this embodiment, a digital circuit for counting periodic clock signals to measure the length of time may be used as the timer circuit 11.

Described in detail below are the operations, which are carried out during the T3-to-T5 period, for preventing the output of an excessive current by detecting the output current.

If the control voltage VG is continuously at a low level from the time T2, the output terminal voltage Vout is gradually reduced and becomes smaller than the reference voltage Vref in due time. Then, the output of the comparator 10 is placed at a high level. At the time of T3, the logic circuit 17 does not prevent the output signal of the comparator 10 from being transmitted to the output section of the logic circuit 17; therefore, the logic circuit 17 outputs a high-level signal in accordance of the output of the comparator 10. In response to this, the timer circuit 11 operates to output a high-level signal for a given period of time. During the time period over which the timer circuit 11 outputs a high-level signal, i.e., during the T3-to-T5 period, the switching circuit 11 carries out a switching operation so that the control voltage VG applied to the output MIS transistor 6 is forcefully placed at a high level. Therefore, the output MIS transistor 6 is OFF for a period of time determined by the operation of the timer circuit 11 to prevent power consumption in the output MIS transistor 6, thus gradually lowering the current flowing through the coil 3 from the level slightly above the target value. As a result, the output MIS transistor 6 is protected from the excessive current.

Next, when the output MIS transistor 6 is turned OFF at the time of T4, the output terminal voltage Vout becomes close to 0V again, and the output of the logic circuit 17 is again placed at a low level. In this embodiment, the waveform of the high-level output of the logic circuit 17 is a differential pulse-like waveform, and the pulse width thereof is determined by the sum of the response time required for the output of the timer circuit 11 to be at a high level, the response time required for the switching operation of the timer circuit 11, and the response time required for the logic circuit 17.

As described above, even if no resistor used for the detection of the output current is provided, the output MIS transistor 6 can be turned OFF so as to prevent the output current exceeding the target value from flowing therethrough by comparing the output terminal voltage Vout with the predetermine reference voltage Vref in the output circuit of the first embodiment. Thus, the output circuit of the first embodiment not only protects the output MIS transistor 6 from the excessive current but also has the function of preventing heat generation in the output MIS transistor 6.

Described in detail below is the relationship between the output terminal voltage Vout and the reference voltage Vref during the current detection of the comparator 10.

First, suppose that $R_{on1}$ denotes an ON-state resistance of the output MIS transistor 6 and that $I_o$ denotes an output current allowed to flow when the output MIS transistor 6 is ON. Then, the output terminal voltage Vout while the output MIS transistor 6 is in ON state is represented by the following Expression (1):

$$Vout = Vcc - I_o \times R_{on1} \tag{1}$$

Furthermore, suppose that $R_{on18}$ denotes an ON-state resistance of the reference MIS transistor 18 and that $I_1$ denotes the value of the current flowing through the reference MIS transistor 18. Then, the reference voltage Vref is represented by the following Expression (2):

$$Vref = Vcc - I_1 \times R_{on18} \tag{2}$$

Suppose that based on a comparison between the reference voltage Vref and the output terminal voltage Vout performed by the comparator 10, the following Expression (3) is established:

$$Vref < Vout \tag{3}$$

In such a case, the output of the comparator 10 is at a low level, and during this time period, a current can be supplied via the output MIS transistor 6. Then, based on Expressions (1), (2) and (3), the following Expression (4) is established:

$$I_o < (R_{on18}/R_{on1}) \times I_1 \tag{4}$$

As can be seen from Expression (4), the output current $I_o$ is determined by the value of the current flowing through the reference MIS transistor 18, and the ratio between the ON-state resistance of the output MIS transistor 6 and that of the reference MIS transistor 18.

As for the electric characteristic of a MIS transistor, it is a known fact that an increase in the current-driving capability of the MIS transistor is proportional to the gate width thereof (not shown) while a decrease in the ON-state resistance of the MIS transistor is inversely proportional to the gate width thereof. Accordingly, the ratio between the ON-state resistance of the output MIS transistor 6 and that of the reference MIS transistor 18 can be easily adjusted by changing the shape and size of a mask to be used in a manufacturing process common to the output and reference MIS transistors 6 and 18 (e.g., an impurity diffusion process). Therefore, in order to ensure the ratio between the electric characteristic of the output MIS transistor and that of the reference MIS transistor, the output and reference MIS transistors 6 and 18 preferably have identical structures, and are preferably located adjacent to each other on a chip so that they are oriented similarly. In such a case, the accuracy of detection of the output current can be improved.

As described above, in the output circuit of the first embodiment, it is possible to prevent the current exceeding the target value from flowing through the output MIS transistor 6 without using a resistor for current detection. Thus, it is also possible to realize the lower power consumption and the expansion of the range of usable supply voltage as already described above. Furthermore, since the output circuit can be integrated on a chip with other circuits, an apparatus provided with the output circuit of the first embodiment can be reduced in size.

Also, in the output circuit of the first embodiment, both the output and reference MIS transistors 6 and 18 are p-channel MIS transistors. Thus, the output circuit of the first embodiment is advantageous in that a circuit design can be carried out more easily compared with the output circuit using n-channel transistors.

Although the logic circuit 17 is configured to include the AND circuit 16 and the inverter 15 in the output circuit of the first embodiment, the present invention is not limited to this configuration. The logic circuit 17 may be configured in a different manner as long as the logic circuit 17 outputs a signal only when the output MIS transistor 6 is ON and the output terminal voltage Vout is lower than the reference voltage Vref.

Similarly, the control circuit 14 is also not limited to the configuration described above. The control circuit 14 may be configured in a different manner as long as the control circuit 14 can turn the output MIS transistor 6 OFF at least when the output terminal voltage Vout is lower than the reference voltage Vref during the time period over which the output MIS transistor 6 is in ON state.

It should be noted that although the switching circuit 13 used in the control circuit 14 of the first embodiment is often provided in combination with a logic circuit, the switch circuit 13 may be an analogue switch as long as it regulates the control voltage.

It should also be noted that in the foregoing description, the power supply unit 1 is either a power supply line connected to an external power supply or an external power supply itself.

(Second Embodiment)

Described below is an exemplary configuration of an output circuit according to a second embodiment of the present invention in which output and reference MIS transistors are each formed by an n-channel transistor.

Figure 3:
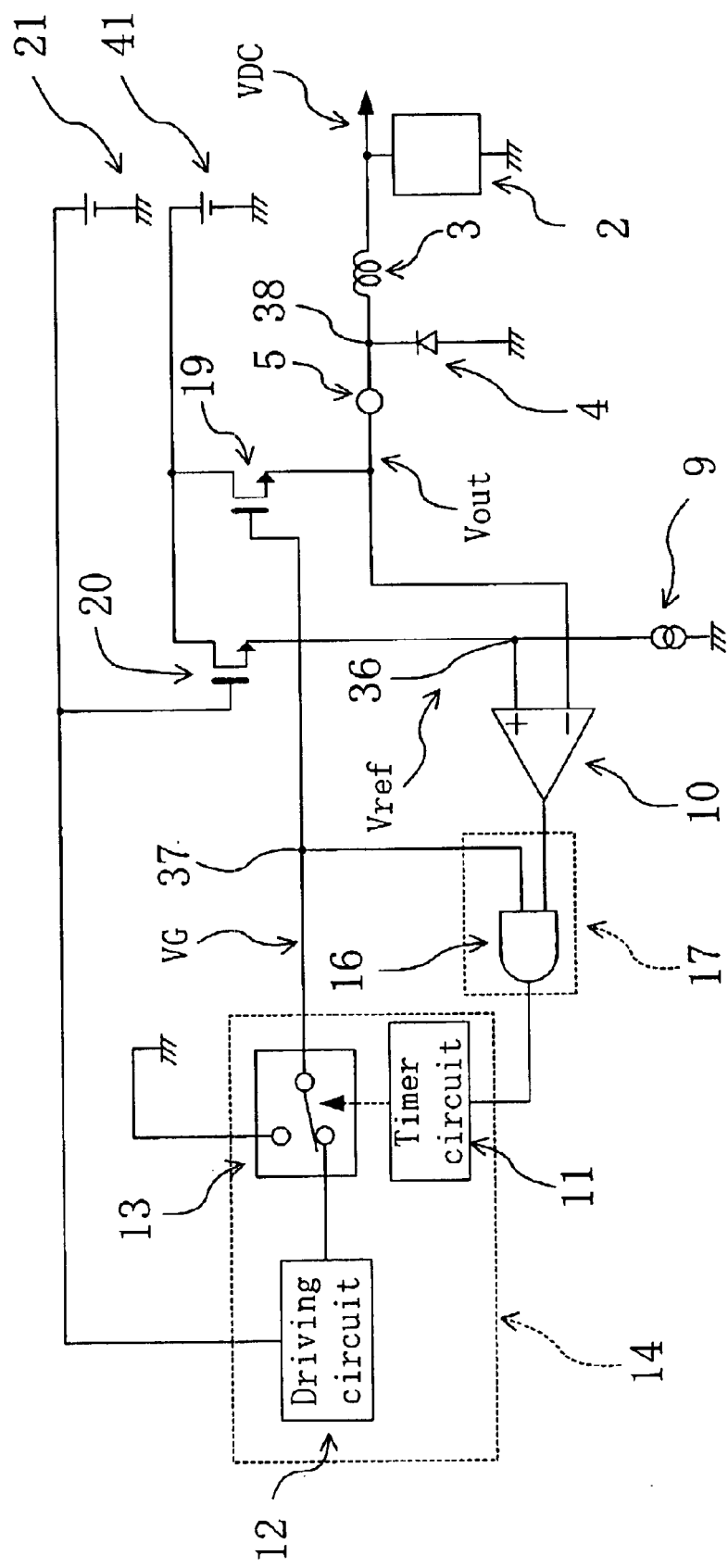
FIG. 3 is a circuit diagram showing the configuration of an output circuit according to a second embodiment of the present invention.

FIG. 3 is a circuit diagram showing the configuration of the output circuit according to the second embodiment.

As shown in FIG. 3, the output circuit of the second embodiment includes: a main power supply unit 41 for supplying the output circuit with a voltage; a second power supply unit 21 for supplying a voltage higher than that of the main power supply unit 41; an output terminal 5 through which power is supplied to an external load circuit 2; an output MIS transistor 19 that is an n-channel MIS transistor provided between the main power supply unit 41 and the output terminal 5; a current supply unit 9 with one end thereof connected to the ground and the other end thereof connected to the main power supply unit 41; a reference node 36; a reference MIS transistor 20 that is an n-channel MIS transistor; a comparator 10 with one input section thereof connected to the reference node 36 and the other input section thereof connected to the output terminal 5; a logic circuit 17 an input section of which is connected with the output section of the comparator 10; a control circuit 14, which is connected to the output section of the logic circuit 17, the second power supply unit 41, the ground, and a gate electrode of the output MIS transistor 19, for carrying out the ON/OFF control of the output MIS transistor 19; and a second node 37 provided between the control circuit 14 and the gate electrode of the output MIS transistor 19. The reference node 36 and the reference MIS transistor 20 are provided between the current supply unit 9 and the main power supply unit 41 in this order. In this configuration, the reference MIS transistor 20 is invariably in ON state since the gate electrode thereof is connected to the second power supply unit 21, and the voltage generated at the reference node 36 (i.e., a reference voltage Vref) is held constant due to a constant bias current supplied from the current supply unit 9 and an ON-state resistance of the reference MIS transistor 20.

Furthermore, in the second embodiment, the logic circuit 17 includes an AND circuit 16 having one input section thereof connected with the output section of the comparator 10 and the other input section thereof connected with the second node 37.

In addition, the control circuit 14 includes: a timer circuit 11 to which an output signal from the AND circuit 16 is inputted; a driving circuit 12 connected to the second power supply unit 21; and a switching circuit 13 for carrying out, in response to a signal from the timer circuit 11, a switching operation to block an output signal from the driving circuit 12 or to allow the output signal to be inputted to the gate electrode of the output MIS transistor 19. In this embodiment, the timer circuit 11 detects the rising edge of an output signal from the AND circuit 16, and outputs a high-level signal for a given period of time. As the timer circuit 11, for example, a one-shot multivibrator or a digital circuit for counting periodic clock signals to measure the length of time is preferably used.

Further, like the first embodiment, the output circuit of the second embodiment allows the output and reference MIS transistors 19 and 20 to be integrated on a single chip. Thus, the entire output circuit can be integrated on a single chip with other circuits.

Furthermore, the output terminal 5 is connected to a load circuit 2 including a resistor, a capacitor and so on. Between the output terminal 5 and the load circuit 2, a first node 38 located closer to the load circuit 2 and a coil 3 for generating electromagnetic energy are provided in this order. The first node 38 is connected to the output terminal of a diode 4 the input terminal of which is connected to the ground. It is to be noted that "load circuit 2" is a generic name for various kinds of circuits (e.g., a motor circuit and so forth), and refers to a circuit that includes a capacitor and that is driven by an electrical signal. The load circuit 2, the coil 3 and the diode 4 are normally provided outside the output circuit.

The output circuit of the second embodiment is different from that of the first embodiment in that n-channel MIS transistors are used as the output and reference MIS transistors and that the second power supply unit 21 for supplying a voltage higher than that of the main power supply unit 41 is added.

Accordingly, the configuration of the output circuit of the second embodiment differs from that of the output circuit of the first embodiment in the following points:

(1) The driving circuit 12 is operated by the power supplied from the second power supply unit 21, and a high-level output voltage from the driving circuit 12 is greater than the voltage of the main power supply unit 41.

(2) Although a p-channel MIS transistor is used to form a common-source amplifier in the first embodiment, an n-channel MIS transistor is used to form a source follower circuit in the second embodiment.

(3) In order to keep the reference MIS transistor 20 in ON state invariably, the gate electrode thereof is connected to the second power supply unit 21.

(4) As a result of the operation of the timer circuit 11, the control voltage VG is placed at a level corresponding to a ground voltage.

The second power supply unit 21 is necessary in the second embodiment because the reference MIS transistor 20 cannot be sufficiently in ON state by merely raising the gate voltage of each of the output and reference MIS transistors 19 and 20 to a level of the voltage applied from the main power supply unit 41. Therefore, in order to allow the reference MIS transistor 20 to be in ON state completely, it is necessary to apply a higher voltage to the gate electrode of the reference MIS transistor 20 by using the second power supply unit 21.

In the above-described configuration, the output MIS transistor 19 in the output circuit of the second embodiment is in ON state during the time period over which the output voltage of the control circuit 14 is at a high level, and is in OFF state during the time period over which the output voltage of the control circuit 14 is at a low level. Other than this feature, the circuits such as the comparator 10, the timer circuit 11 and the switching circuit 13 are operated in accordance with the ON/OFF states of the output MIS transistor 19 in the same manner as those of the first embodiment.

Hereinafter, the operation of the output circuit of the second embodiment will be briefly described.

In the output circuit of the second embodiment, the output current when the output MIS transistor 19 is in ON state is detected by comparing the output terminal voltage Vout of the output terminal 5 with the reference voltage Vref like the first embodiment.

First, when the output terminal voltage Vout outputted from the output terminal 5 is lower than the reference voltage Vref, a high-level signal is outputted from the comparator 10. Then, the output from the comparator 10 and the control voltage VG applied to the gate electrode of the output MIS transistor 19 are inputted to the AND circuit 16, and a high-level signal is outputted from the timer circuit 11 only when the output MIS transistor 19 is in ON state and the output terminal voltage Vout outputted from the output terminal 5 is smaller than the reference voltage Vref. In this case, the timer circuit 11 outputs a high-level signal for a given period of time, and during this time period, the switching circuit 13 allows a ground potential to be applied to the gate electrode of the output MIS transistor 19. As a result, the value of the current outputted from the output terminal 5 becomes smaller than the target value.

In this manner, like the first embodiment, the output circuit of the second embodiment can prevent the current exceeding the set value from flowing through the output MIS transistor 19. Furthermore, since no resistor has to be provided between the main power supply unit 41 and the output MIS transistor 19, power consumption can be lower than the conventional output circuit. Besides, since the output circuit can be integrated on a single chip with other circuits, it is possible to reduce the size of the apparatus into which the output circuit of the second embodiment is incorporated. In addition, since the output and reference MIS transistors 19 and 20 are n-channel MIS transistors having identical structures, the output and reference MIS transistors 19 and 20 can be formed in a common impurity diffusion process, thus making the electric characteristics of the transistors uniform. As a result, the accuracy of definition of the ratio between the ON-state resistance of the output MIS transistor 19 and that of the reference MIS transistor 20 is improved, thus making it possible to increase the accuracy of detection of the output current.

In general, the ON-state resistance of an n-channel MIS transistor can be smaller that that of a p-channel MIS transistor, and an n-channel MIS transistor can be superior to a p-channel MIS transistor in current-driving capability. Therefore, by using n-channel MIS transistors as the output and reference MIS transistors in the output circuit of the second embodiment, the output current can be increased compared with the case where p-channel MIS transistors are used. Furthermore, the output circuit of the second embodiment is also preferably used if the supply voltage for an IC is low.

In the second embodiment, in order to allow the output and reference MIS transistors 19 and 20 to be sufficiently in ON state when the control voltage VG is at a high level, the output voltage of the second power supply unit 21 (which is at a high level if the second power supply unit 21 includes a bootstrap circuit) is greater than the voltage of the main power supply unit 41 by a value equal to or higher than each threshold voltage of the MIS transistors.

The second power supply unit 21 may include a direct-current power supply circuit that is provided apart from the main power supply unit 41, or a charge pump circuit for increasing the output voltage from the main power supply unit 41. Alternatively, the second power supply unit 21 may include a bootstrap circuit for supplying power in accordance with a change in the output voltage of the output MIS transistors 19 by applying a DC voltage to a capacitor (not shown) coupled to the output terminal 5 so that the capacitor accumulates electrical charge.

Figure 4:
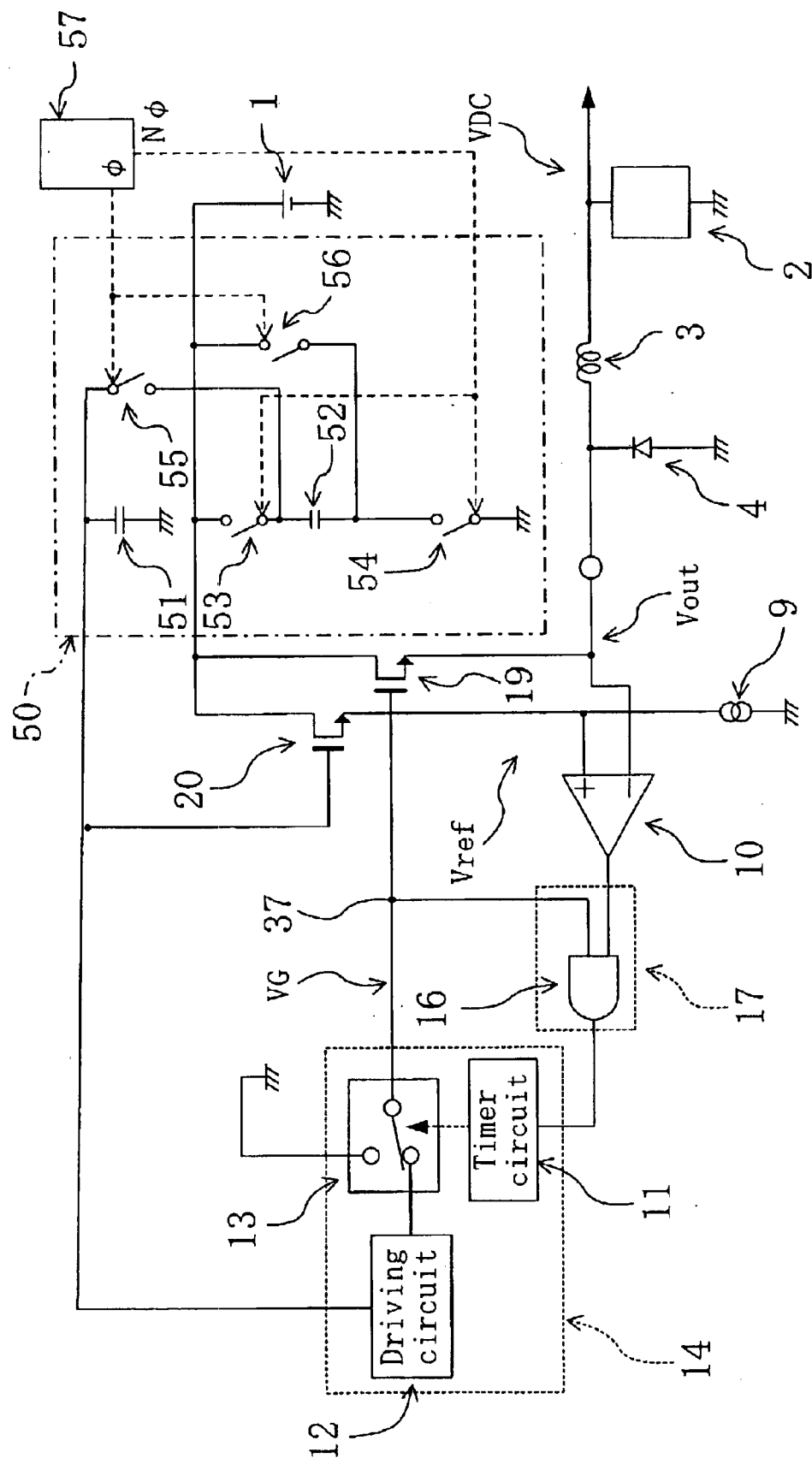
FIG. 4 is a circuit diagram showing the configuration of the output circuit according to the second embodiment in which a second power supply unit includes a charge pump circuit.

FIG. 4 is a circuit diagram showing the configuration of the output circuit of the second embodiment in which the second power supply unit includes a charge pump circuit 50.

As shown in FIG. 4, the charge pump circuit 50, indicated by the alternate long and short dashed line, includes capacitors 51 and 52, and switch elements 53, 54, 55 and 56, and is controlled by positive pulse φ and inverted pulse N φ that are outputted from a clock pulse generator 57.

First, when the switch elements 53 and 54 are turned ON in response to the positive pulse φ and the switch elements 55 and 56 are turned OFF in response to the inverted pulse N φ, the capacitor 52 is connected between the terminals of a first power supply unit 1, and electrical charge is accumulated in the capacitor 52.

On the other hand, when the switch elements 53 and 54 are turned OFF in response to the inversion of the positive pulse φ and the switch elements 55 and 56 are turned ON in response to the inversion of the inverted pulse N φ, one terminal of the capacitor 52 at which a low potential is applied is connected to the first power supply unit 1 while the other terminal of the capacitor 52 at which a high potential is applied is connected to the capacitor 51. In this case, the electrical charge accumulated in the capacitor 52 flows toward the capacitor 51 to increase the voltage between the terminals of the capacitor 51.

The output circuit continuously repeats the above-described operations to generate a voltage higher than the voltage of the first power supply unit 1 between the terminals of the capacitor 51. It should be noted that although FIG. 4 shows a specific exemplary configuration of the output circuit in which the second power supply unit includes a charge pump circuit, similar output circuits may be provided by circuit configurations other than this.

Figure 5:
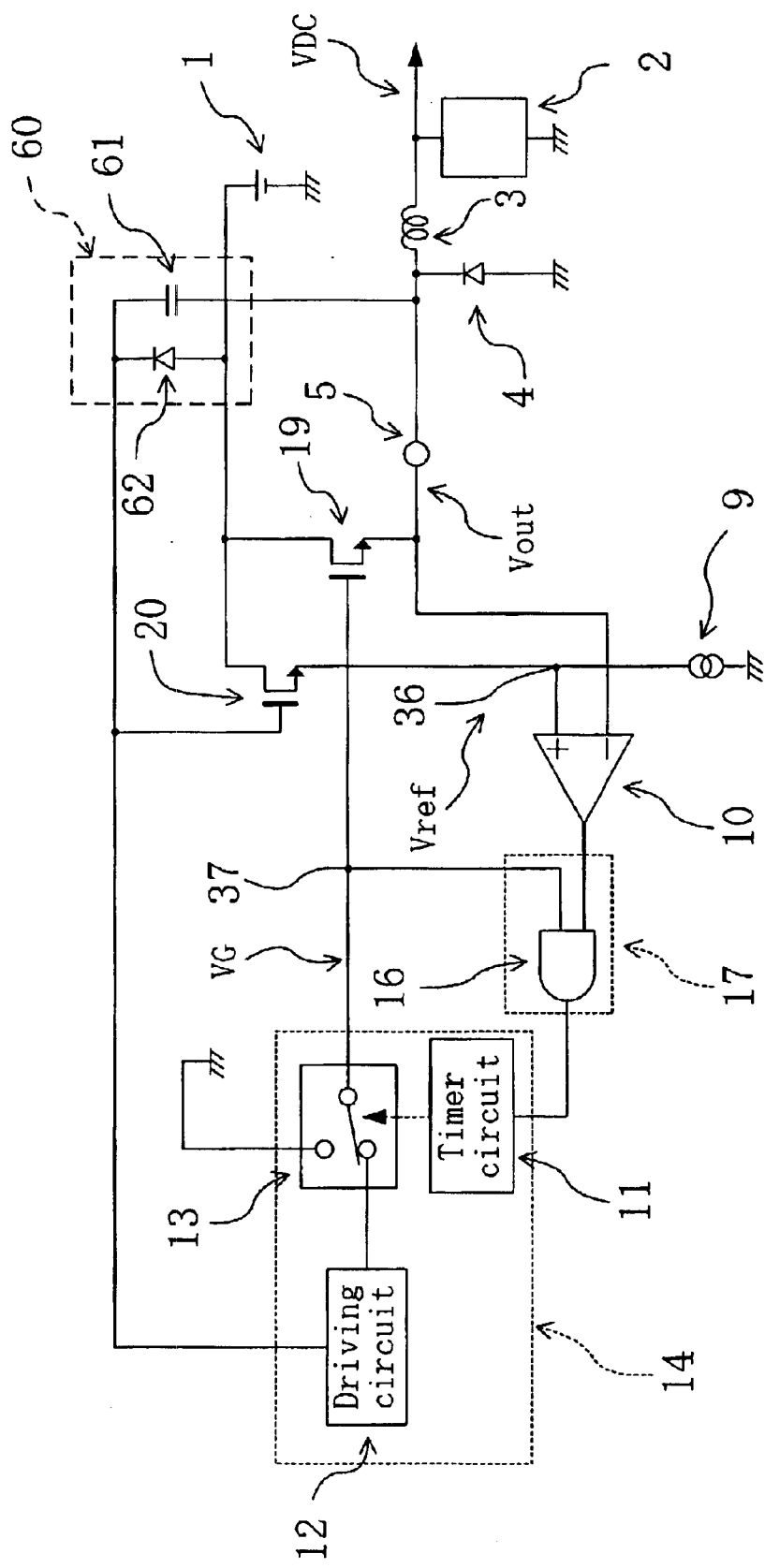
FIG. 5 is a circuit diagram showing the configuration of the output circuit according to the second embodiment in which the second power supply unit includes a bootstrap circuit.

Furthermore, FIG. 5 is a circuit diagram showing the configuration of the output circuit of the second embodiment in which the second power supply unit includes a bootstrap circuit 60 (which is indicated by the broken line). As used herein, "bootstrap circuit" means a circuit for generating a supply voltage that varies in accordance with a change in the output voltage of the output terminal.

As shown in FIG. 5, the bootstrap circuit 60 in the output circuit of this embodiment includes: a diode 62 connected to the first power supply unit 1; and a capacitor 61 connected between a cathode of the diode 62 and the output terminal 5. The bootstrap circuit 11 operates as follows.

First, when a switching operation is carried out to turn the output MIS transistor 19 OFF and the potential of the output terminal 5 becomes equal to a ground potential, a current flows into the capacitor 61 via the diode 62 so that a voltage substantially equal to the voltage of the first power supply unit 1 is applied between the terminals of the capacitor 61.

Next, when the output MIS transistor 19 is turned ON and the potential of the output terminal 5 is at a high level, the diode 62 is brought out of conduction, and the supply voltage increased to a level higher than the voltage of the first power supply unit 1 is fed to the gate electrode of the reference MIS transistor 20 and the driving circuit 12.

In this example, since the supply voltage of the second power supply unit varies in accordance with the voltage level of the output terminal 5, the output and reference MIS transistors 19 and 20 have to be sufficiently in ON state. According to this embodiment, when the potential of the output terminal 5 is at a high level, the increased supply voltage can be fed to the gate electrode of the reference MIS transistor 20 and the driving circuit 12. Furthermore, when the potential of the output terminal 5 is at a low level (i.e., at a level equal to a ground potential), the supply voltage of the second power supply unit becomes lower than the voltage of the first power supply unit 1 by 0.7V (i.e., a diode forward voltage). However, since the output MIS transistor 19 is OFF during this period, the output circuit can carry out the detection of excessive current or short circuit, and the proper functions of a power supply circuit without a hitch.

(Third Embodiment)

An output circuit according to a third embodiment of the present invention is configured such that a bias current used to generate a reference voltage (i.e., a current flowing through a reference MIS transistor) is reduced to realize lower power consumption.

Figure 6:
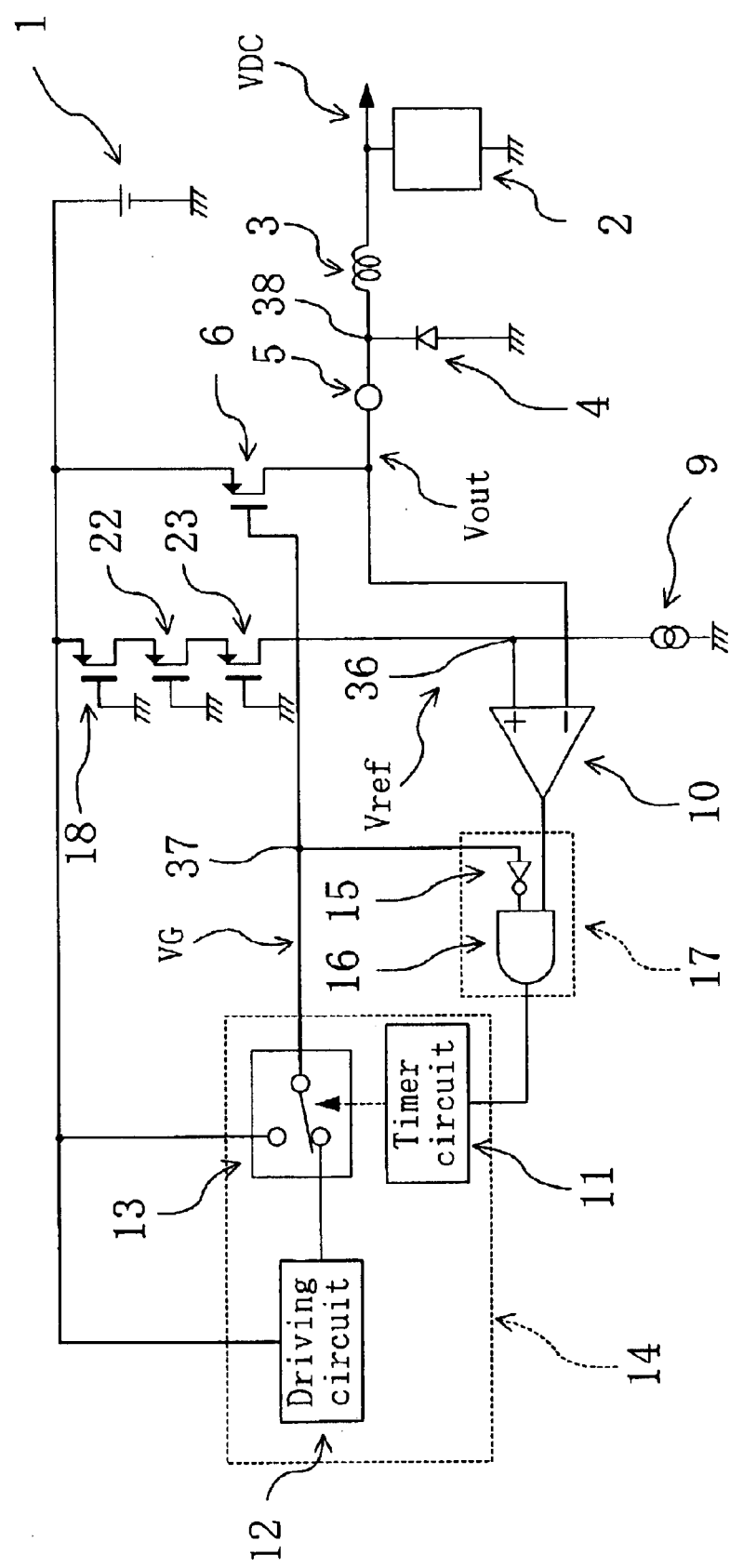
FIG. 6 is a circuit diagram showing the configuration of an output circuit according to a third embodiment of the present invention.

FIG. 6 shows the configuration of the output circuit of the third embodiment. As shown in FIG. 6, the output circuit of the third embodiment is configured substantially in the same manner as the output circuit of the first embodiment. However, the third embodiment differs from the first embodiment in that second and third reference MIS transistors 22 and 23 each of which is a p-channel MIS transistor are further provided between a first reference MIS transistor 18 (which is also a p-channel MIS transistor) and a reference node 36.

Specifically, as shown in FIG. 6, the output circuit of the third embodiment includes: a power supply unit 1 for supplying the output circuit with a voltage; an output terminal 5 through which power is supplied to an external load circuit 2; an output MIS transistor 6 that is a p-channel MIS transistor provided between the power supply unit 1 and the output terminal 5; a current supply unit 9 with one end thereof connected to the ground and the other end thereof connected to the power supply unit 1; the reference node 36; the third reference MIS transistor 23; the second reference MIS transistor 22; the first reference MIS transistor 18; a comparator 10 with one input section thereof connected to the reference node 36 and the other input section thereof connected to the output terminal 5; a logic circuit 17 an input section of which is connected, at one end thereof, with the output section of the comparator 10; a control circuit 14, which is connected to the output section of the logic circuit 17, the power supply unit 1, and a gate electrode of the output MIS transistor 6, for carrying out the ON/OFF control of the output MIS transistor 6; and a second node 37 provided between the control circuit 14 and the gate electrode of the output MIS transistor 6. The reference node 36, the third reference MIS transistor 23, the second reference MIS transistor 22, and the first reference MIS transistor 18 are provided between the current supply unit 9 and the power supply unit 1 in this order. In this embodiment, the first, second and third reference MIS transistors 18, 22 and 23 are similar in gate width and structure to the reference MIS transistor of the first embodiment. Furthermore, the MIS transistors 18, 22 and 23 are invariably in ON state by having the gate electrodes thereof connected to the ground.

In the output circuit of the third embodiment, suppose that $R_{on18}$, $R_{on22}$, $R_{on23}$ denote ON-state resistances of the first, second and third reference MIS transistors 18, 22 and 23, respectively, and that $I_1$ denotes a bias current from the current supply unit 9. Then, a voltage applied to the reference node 36, i.e., a reference voltage Vref, is represented by the following Expression (5):

$$Vref = Vcc - I_1 \times (R_{on18} + R_{on22} + R_{on23}) \qquad (5)$$

Based on Expression (5), and Expressions (1) and (3) shown above, the following Expression (6) is established:

$$I_o < \{(R_{on18} + R_{on22} + R_{on23})/R_{on1}\} \times I_1 \qquad (6)$$

Since the ON-state resistances of the first, second and third reference MIS transistors 18, 22 and 23 are of equal value in Expression (6), the following Expression (7) holds true:

$$I_o < (3 R_{on18}/R_{on1}) \times I_1 \qquad (7)$$

Thus, it can be seen from Expression (7) that the output circuit of the third embodiment allows the detection of the output current $I_o$ equal to that of the first embodiment in magnitude by using a bias current cut down to one-third of the bias current used in the first embodiment, and that the current consumption required for the circuit operation can be reduced. Furthermore, as can be seen from Expression (5), the reference voltage Vref may be adjusted while the bias current is kept constant.

It should be noted that although an exemplary configuration in which three reference MIS transistors are used has been described in the third embodiment, the number of MIS transistors to be provided may be changed if necessary. That is, in the output circuit of the third embodiment, it is possible to set the level of the output current to be detected and reduce the bias current in accordance with the number of MIS transistors to be provided. Besides, while ensuring the ON-state resistance ratio, the output circuit can detect the output current accurately and limit the value of the output current flowing through the output MIS transistor. As a result, the output MIS transistor can be protected from the output current.

In the output circuit of the third embodiment, if the reference voltage Vref is kept unchanged, the number of reference MIS transistors may be increased to reduce the bias current, thus realizing lower power consumption. And if the bias current is kept unchanged, the value of the reference voltage Vref may be lowered, thus setting a high target value for the output current to be detected.

Furthermore, according to the third embodiment, if the output current, bias current and reference voltage are kept unchanged, the accuracy of definition of the ON-state resistance ratio of the transistors can be improved. For example, in the first embodiment, if the ratio between the ON-state resistance of the output MIS transistor and that of the reference MIS transistor needs to be set at 1–300, the gate width of the output MIS transistor is set to be 300 times as large as that of the reference MIS transistor. However, if the difference between the gate width of the output MIS transistor and that of the reference MIS transistor is large, it is hard to make the electric characteristics of the transistors uniform compared with the case where equal-sized transistors are used. Therefore, by providing three reference MIS transistors like the third embodiment, the ratio between the gate width of the output MIS transistor and that of each reference MIS transistor can be set at 1–100, thus making the electric characteristics of the transistors uniform even further. Consequently, it is possible to limit the value of the output current with a higher degree of accuracy.

It should be noted that although a plurality of reference MIS transistors that are equal to each other in gate width are provided in the third embodiment, a plurality of reference MIS transistors that are different in gate width may be provided if necessary.

(Fourth Embodiment)

An output circuit according to a fourth embodiment of the present invention differs from the output circuit of the third embodiment in that the output and reference MIS transistors are each formed by an n-channel MIS transistor, and differs from the output circuit of the second embodiment in that the three reference MIS transistors are provided.

Figure 7:
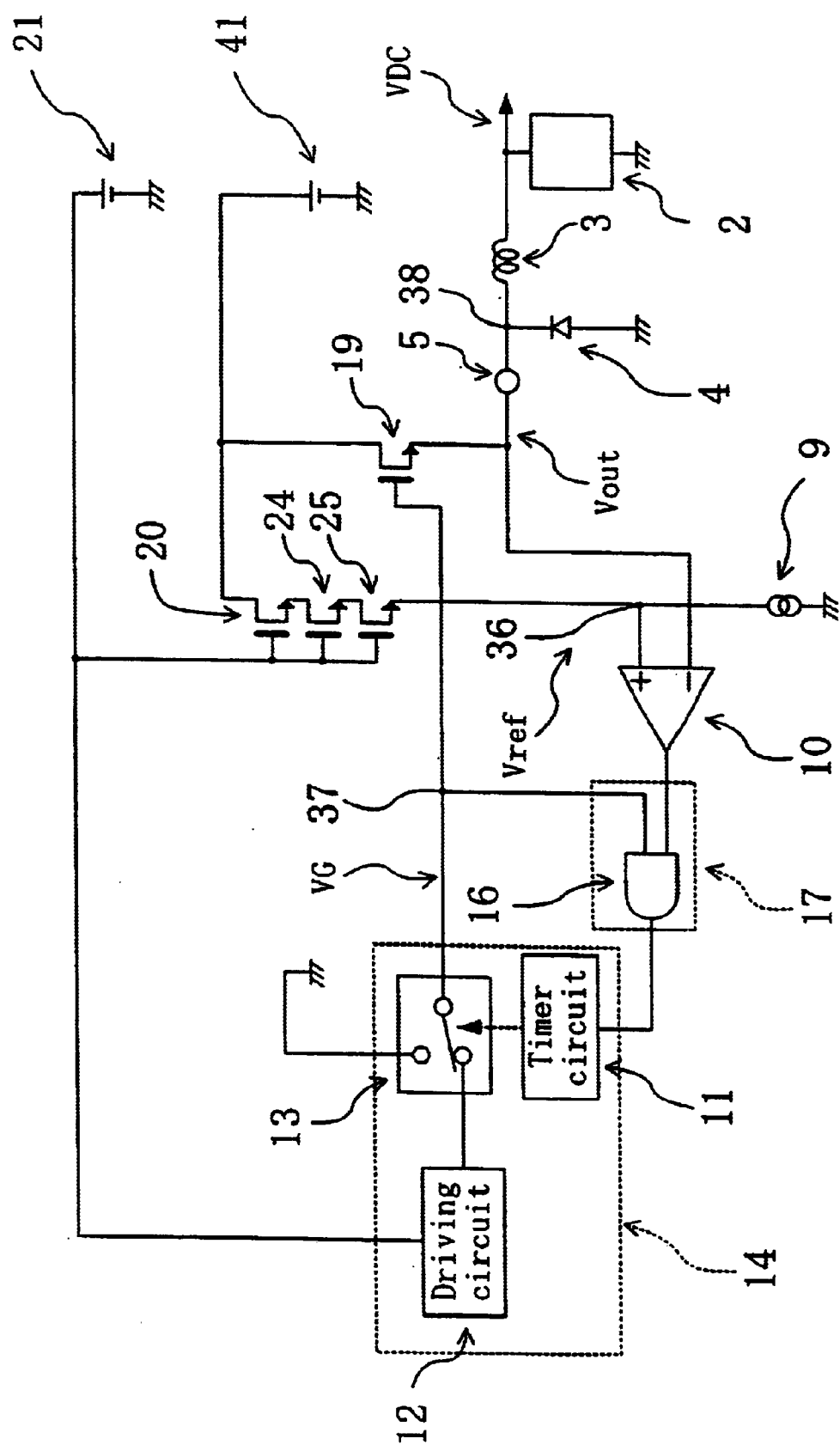
FIG. 7 is a circuit diagram showing the configuration of an output circuit according to a fourth embodiment of the present invention.

FIG. 7 shows the configuration of the output circuit according to the fourth embodiment. In FIG. 7, the same components as the counterparts shown in FIGS. 1 and 3 are identified by the same reference characters.

As shown in FIG. 7, the output circuit of the fourth embodiment includes: a main power supply unit 41 for supplying the output circuit with a voltage; a second power supply unit 21 for supplying a voltage higher than that of the main power supply unit 41; an output terminal 5 through which power is supplied to an external load circuit 2; an output MIS transistor 19 that is an n-channel MIS transistor provided between the main power supply unit 41 and the output terminal 5; a current supply unit 9 with one end thereof connected to the ground and the other end thereof connected to the main power supply unit 41; a reference node 36; a third reference MIS transistor 25; a second reference MIS transistor 24; a first reference MIS transistor 20; a comparator 10 with one input section thereof connected to the reference node 36 and the other input section thereof connected to the output terminal 5; a logic circuit 17 an input section of which is connected with the output section of the comparator 10; a control circuit 14, which is connected to the output section of the logic circuit 17, the second power supply unit 21, the ground, and a gate electrode of the output MIS transistor 19, for carrying out the ON/OFF control of the output MIS transistor 19; and a second node 37 provided between the control circuit 14 and the gate electrode of the output MIS transistor 19. The reference node 36, the third reference MIS transistor 25, the second reference MIS transistor 24, and the first reference MIS transistor 20 are provided between the current supply unit 9 and the main power supply unit 41 in this order. And the first, second and third reference MIS transistors 20, 24 and 25 are each formed by an n-channel MIS transistor. In this embodiment, the first, second and third reference MIS transistors 20, 24 and 25 are invariably in ON state by having the gate electrodes thereof connected to the second power supply unit 21. Furthermore, the first, second and third reference MIS transistors 20, 24 and 25 are similar in gate width and structure to the reference MIS transistor 20 of the second embodiment.

Even if n-channel MIS transistors are used as the output MIS transistor 19 and the reference MIS transistors 20, 24 and 25 in this manner, it is possible to reduce the bias current $I_1$ and power consumption by setting the output current $I_o$, reference voltage Vref, and ON-state resistance of each reference MIS transistor at the same level as those of the second embodiment.

In addition, if the output current $I_o$, bias current $I_1$ and ON-state resistance of each reference MIS transistor are at the same level as those of the second embodiment, it is possible to reduce the reference voltage Vref, thus setting a high target value for the output current to be detected.

Besides, according to the fourth embodiment, if the output current $I_o$, bias current $I_1$ and reference voltage Vref are kept unchanged, it is possible to improve the accuracy of definition of the ON-state resistance ratio of the MIS transistors, and thus it is possible to detect the value of the output current with a higher degree of accuracy.

Moreover, since the output circuit of the fourth embodiment is provided with n-channel transistors as the output MIS transistor 19 and the reference MIS transistors 20, 24 and 25, the output circuit of the fourth embodiment is more preferably used as an output circuit for driving a load circuit with a lower voltage applied, compared with the output circuit of the third embodiment. Furthermore, the level of the output current to be detected can be further raised.

It should be noted that the number of the reference MIS transistors does not have to be three in the output circuit of the fourth embodiment. Alternatively, transistors having different gate widths may be used as the reference MIS transistors if necessary.

(Fifth Embodiment)

Described below is an exemplary configuration of an output circuit according to a fifth embodiment of the present invention in which a control circuit includes a flip-flop as a latch circuit that can be set and reset. This flip-flop will be herein called an "SR flip-flop".

Figure 8:
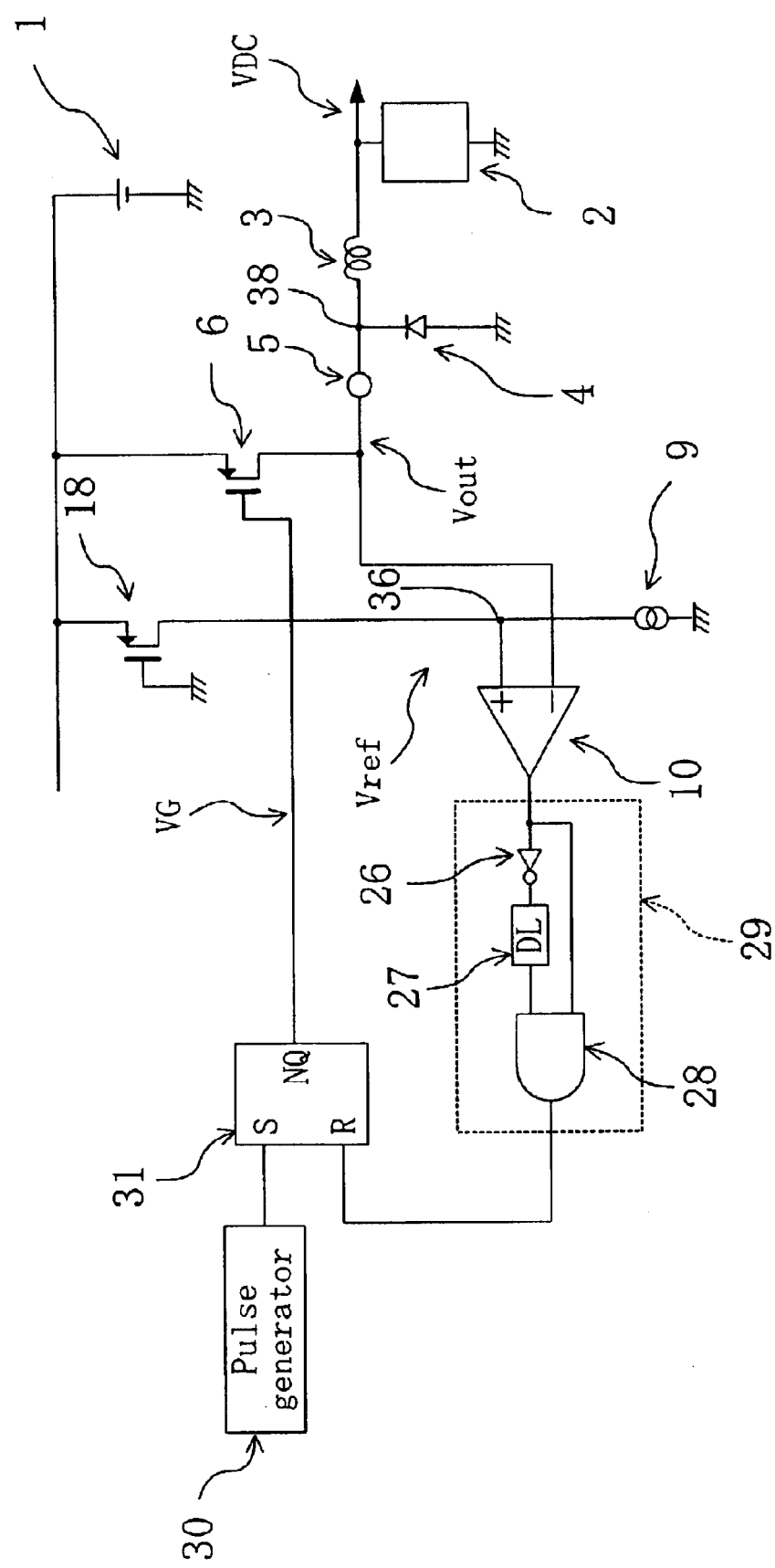
FIG. 8 is a circuit diagram showing the configuration of an output circuit according to a fifth embodiment of the present invention.

FIG. 8 shows the configuration of the output circuit according to the fifth embodiment.

As shown in FIG. 8, the output circuit according to the fifth embodiment includes: a power supply unit 1 for supplying the output circuit with a voltage; an output terminal 5 through which power is supplied to an external load circuit 2; an output MIS transistor 6 that is a p-channel MIS transistor provided between the power supply unit 1 and the output terminal 5; a current supply unit 9 with one end thereof connected to the ground and the other end thereof connected to the power supply unit 1; a reference node 36; a reference MIS transistor 18 that is a p-channel MIS transistor; a comparator 10 with one input section thereof connected to the reference node 36 and the other input section thereof connected to the output terminal 5; an edge detection circuit 29 for receiving, at an input section thereof, an output signal from the comparator 10 to detect a rising edge of the output signal; a pulse generator 30 for generating periodic trigger pulses; and an SR flip-flop 31 having a reset input section that inputs a signal from the edge detection circuit 29 and a set input section that inputs a trigger pulse from the pulse generator 30. The reference node 36 and the reference MIS transistor 18 are provided between the current supply unit 9 and the power supply unit 1 in this order. Further, the ON/OFF control of the output MIS transistor 6 is carried out using a control voltage VG outputted from an inversion output section NQ of the SR flip-flop 31. Furthermore, the reference MIS transistor 18 is invariably in ON state since the gate electrode thereof is connected to the ground, and a reference voltage Vref applied to the reference node 36 is kept constant.

Furthermore, in the fifth embodiment, the edge detection circuit 29 includes: an inverter 26 the input section of which is connected to the comparator 10; a delay circuit 27 for delaying an output signal from the inverter 26 for a given length of time before outputting the signal; and an AND circuit 28 with one input section thereof connected to the output section of the comparator 10 and the other input section thereof connected to the output section of the delay circuit 27. The output of the AND circuit 28 is fed to the reset input section of the SR flip-flop 31.

The output terminal 5 is connected to a load circuit 2 including a resistor, a capacitor and so on. Between the output terminal 5 and the load circuit 2, a first node 38 located closer to the load circuit 2 and a coil 3 for generating electromagnetic energy are provided in this order. The first node 38 is connected to the output terminal of a diode 4 the input terminal of which is connected to the ground. In this embodiment, "load circuit 2" is a generic name for various kinds of circuits (e.g., a motor circuit and so forth), and refers to a circuit that is driven by an electrical signal. The load circuit 2, the coil 3 and the diode 4 are normally provided outside the output circuit.

Described briefly below is the operation of the output circuit of the fifth embodiment.

First, the pulse generator 30 generates periodic narrow trigger pulses to set the SR flip-flop 31. When the trigger pulses are inputted to the SR flip-flop 31, the output of the inversion output section NQ becomes a low-level voltage, and allows the output MIS transistor 6 to be in ON state.

When the output MIS transistor 6 is in ON state, the output current is gradually increased due to the coil 3 and the load circuit 2 that are connected to the output terminal 5. In response to the increase in the output current, a voltage drop between the source and drain of the output MIS transistor 6 is increased, and thus the output terminal voltage Vout gets lower than the drain voltage of the reference MIS transistor 18 (i.e., the reference voltage Vref).

When the output terminal voltage Vout becomes smaller than the reference voltage Vref, the output of the comparator 10 changes from a low level to a high level. In this case, the edge detection circuit 29 detects the rising edge of an output signal from the comparator 10, and feeds a short pulse to the reset input section of the SR flip-flop 31 substantially synchronously with the rising edge. The output (control voltage) VG from the SR flip-flop 31 is placed at a high level by this pulse, and thus the output MIS transistor 6 is turned OFF.

Hereinafter, a current detection method using the output circuit of the fifth embodiment will be described in detail with reference to FIGS. 8 to 10.

FIGS. 10(*a*) through 10(*e*) are timing charts each showing the waveform of voltage or current of each component provided in the output circuit of the fifth embodiment. In each of the charts, the abscissa represents time t.

First, FIG. 10(*a*) shows the waveform of a signal outputted from the pulse generator 30. During the time period over which the signal from the pulse generator 30 is at a high level, the SR flip-flop 31 is set to place the output of the inversion output section NQ at a low level.

FIG. 10(*b*) shows the waveform of the output terminal voltage Vout and the reference voltage Vref. In FIG. 10(*b*), the reference voltage Vref is indicated by the alternate long and short dashed line, and the output terminal voltage Vout is indicated by the solid line. As shown in the chart, the reference voltage Vref is smaller than the supply voltage Vcc by a voltage drop resulting from the ON-state resistance of the reference MIS transistor 18 and the constant current flowing from the current supply unit 9. The output terminal voltage Vout exhibits a value close to the supply voltage Vcc (i.e., the output terminal voltage Vout is at a high level) when the output MIS transistor 6 is turned ON. On the other hand, the output terminal voltage Vout exhibits a value close to a ground voltage (i.e., the output terminal voltage Vout is at a low level) when the output MIS transistor 6 is turned OFF. Furthermore, the output terminal voltage Vout when the output MIS transistor 6 is in ON state varies in accordance with the magnitude of the output current, and tends to decrease almost proportionately to an increase in the magnitude of the output current. In other words, the output MIS transistor 6 in ON state exhibits, at its region between the drain and source, the characteristic substantially similar to that of a resistor.

FIG. 10(*c*) shows the waveform of the current flowing through the coil 3.

As shown in FIG. 10(*c*), the coil 3 serves as a load on the output MIS transistor 6 in the fifth embodiment. Therefore, even if the output MIS transistor 6 is completely in ON state at the time of T0 upon switching of the transistor 6, the impedance of the coil 3 is momentarily increased due to the effect of the counter-electromotive force of the coil 3, and thus virtually no drain current of the output MIS transistor 6 is allowed to flow. Accordingly, the output terminal voltage Vout becomes approximately equal to the power supply voltage Vcc right after the output MIS transistor 6 is turned ON. When electromagnetic energy is accumulated in the coil 3 with the passage of time, the impedance of the coil 3 is reduced correspondingly, and the output current Io is increased. The output terminal voltage Vout is thus gradually reduced. In this case, the current flowing through the coil 3 is increased rectilinearly as shown in FIG. 10(*c*).

FIG. 10(*d*) shows the waveform of the output of the comparator 10, and FIG. 10(*e*) shows the waveform of the output of the edge detection circuit 29. The signals inputted to the edge detection circuit 29 are divided into two groups: one that is directly inputted to the AND circuit 28, and the other that is inverted by the inverter 26, delayed by the delay circuit 27 for a given length of time, and then inputted to the AND circuit 28. Thus, the edge detection circuit 29 outputs, in response to the rising edge of an output signal from the comparator 10, a pulse signal, and the period of time delayed by the delay circuit 27 corresponds to the pulse width of the signal.

Hereinafter, how the output current is detected will be specifically described.

First, as shown in FIGS. 10(*a*) and 10(*b*), when the output of the pulse generator 30 is at a high level at the time of T0, the SR flip-flop 31 is set, and thus the output of the SR flip-flop 31 is placed at a low level. In response to this, the output MIS transistor 6 is turned ON, and the output terminal voltage Vout is placed at a high level close to the supply voltage Vcc. In this case, since the output terminal voltage Vout is greater than the reference voltage Vref, the output of the comparator 10 is at a low level. The edge detection circuit 29 does no respond to the falling edge of an output signal from the comparator 10; therefore, the output of the edge detection circuit 29 remains at a low level.

Next, as shown in FIG. 10(*c*), even if the output of the pulse generator 30 is changed from a high level to a low level at the time of T1, the output of the SR flip-flop 31 does not change. Therefore, the output MIS transistor 6 remains ON, and the output terminal voltage Vout keeps decreasing because the output current continues to increase.

Next, as shown in FIG. 10(*d*), when the output terminal voltage Vout is smaller than the reference voltage Vref at the time of T1, the output of the comparator 10 changes from a low level to a high level. Then, as shown in FIG. 10(*e*), when the output of the comparator 10 is changed from a low level to a high level, the output of the edge detection circuit 29 is at a high level for the length of time delayed by the delay circuit 27.

Next, when the high-level output of the edge detection circuit 29 is fed to the reset input section of the SR flip-flop 31, the flip-flop 31 that has been set is reset, and the output of the inversion output section NQ is placed at a high level, thus allowing the output MIS transistor 6 to be in OFF state. Accordingly, the output terminal voltage Vout is placed at a low level. Furthermore, during the T3-to-T4 period over which the output MIS transistor 6 is in OFF state, the diode 4 is brought into conduction to carry out a regenerative operation, thus releasing the energy accumulated up to this time in the coil 3.

Next, when a high-level signal is outputted from the pulse generator 30 again at the time of T4 to set the SR flip-flop 31, the output MIS transistor 6 is turned ON again. Then, the operations similar to those carried out during the T0-to-T3 period are repeated.

By carrying out the above-described operations, the output circuit of the fifth embodiment is controlled so as to prevent the current exceeding the limit from flowing through the output MIS transistor 6.

As described above, the control of the output MIS transistor 6 is carried out by the SR flip-flop 31 in the fifth embodiment. Other than this, the components of the output circuit of the fifth embodiment and those of the output circuits of the first through fourth embodiments operate similarly in limiting the output current by carrying out the current detection utilizing the ON-state resistance of the output MIS transistor 6.

The output circuit of the fifth embodiment is superior to those of the first through fourth embodiments in its difficulty in being affected by a noise coming from, for example, an external coil. If the noise reaches a timer circuit, the timer circuit might malfunction in no time and output a high-level signal. To the contrary, even if the noise reaches the input section of the SR flip-flop 31, the SR flip-flop 31 has a lower probability of malfunctioning and outputting a high-level signal than a timer circuit. Accordingly, the reliability of the output circuit of the fifth embodiment is higher than that of the output circuit having a timer circuit.

Furthermore, like the output circuits of the first through fourth embodiments, the output circuit of the fifth embodiment can be integrated on a single chip with other circuits. Thus, the apparatus provided with the output circuit can be reduced in size.

Although p-channel transistors are used as the output MIS transistor 6 and the reference MIS transistor 18 in the output circuit of the fifth embodiment, n-channel transistors may be used instead.

Figure 9:
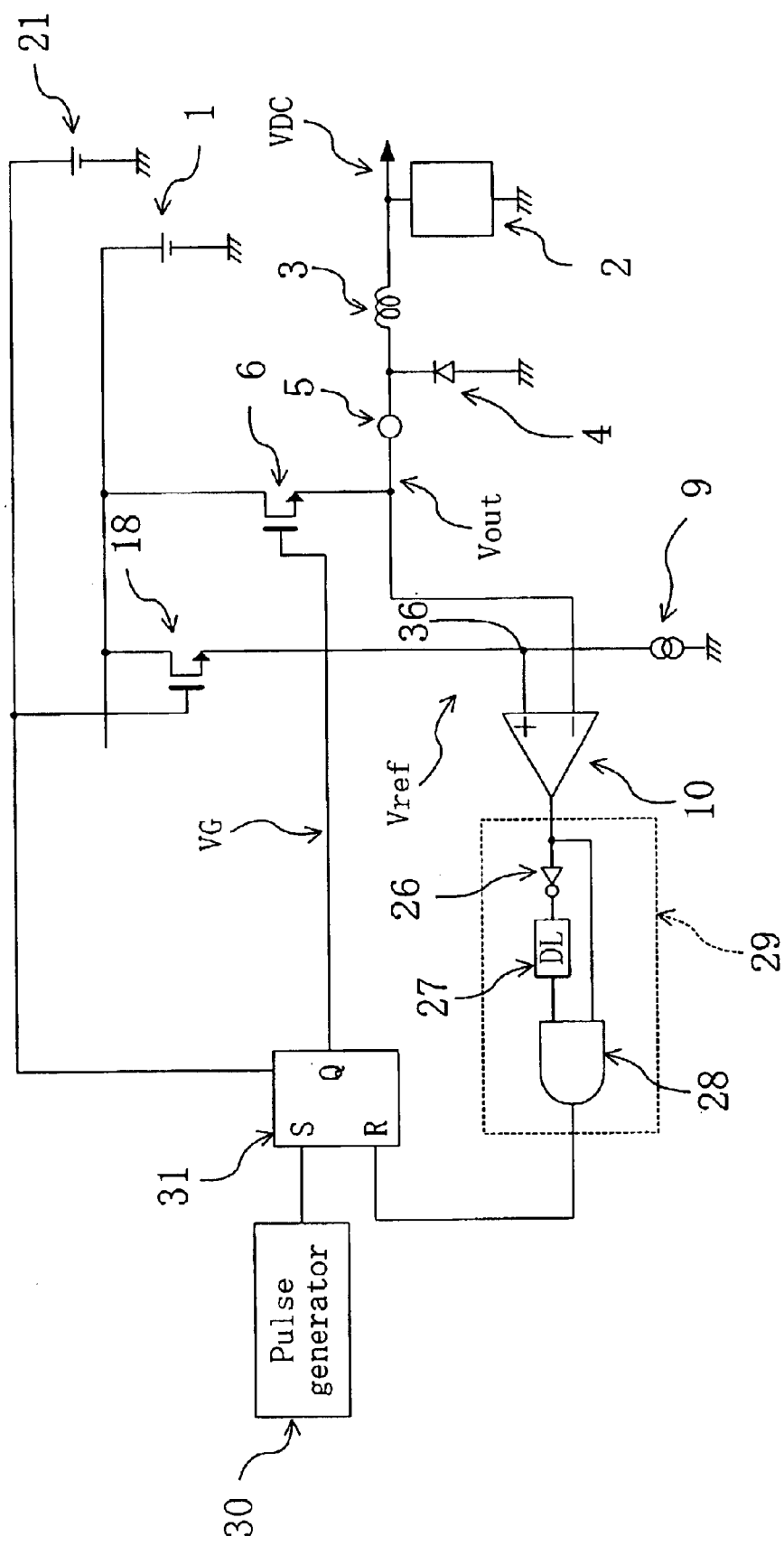
FIG. 9 is a circuit diagram showing the configuration of the output circuit according to the fifth embodiment using n-channel MIS transistors.
Figure 10A:
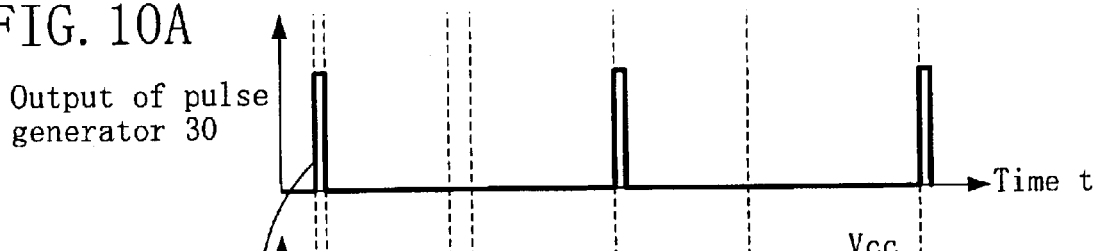
FIGS. 10(a) through 10(e) are timing charts each showing the waveform of voltage or current of each component provided in the output circuit of the fifth embodiment.
Figure 10B:
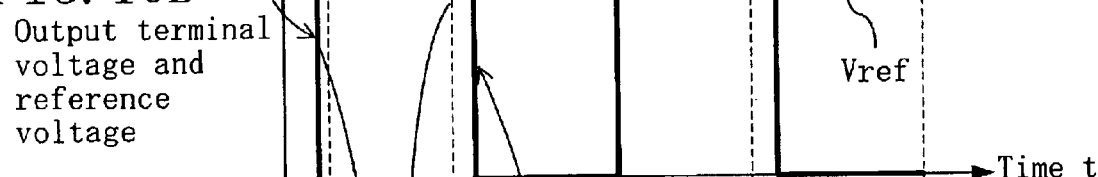
Figure 10C:
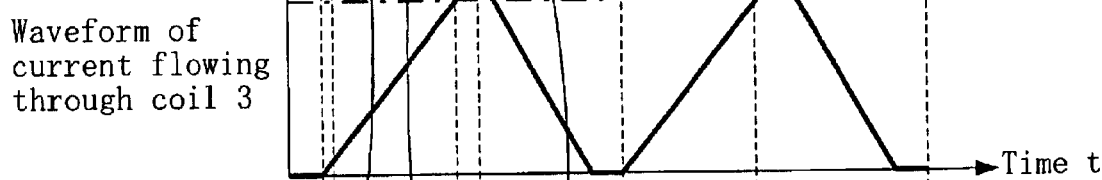
Figure 10D:
Figure 10E:
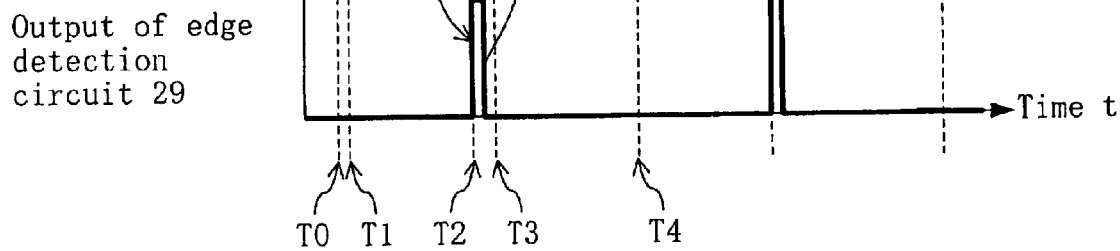
Figure 11:
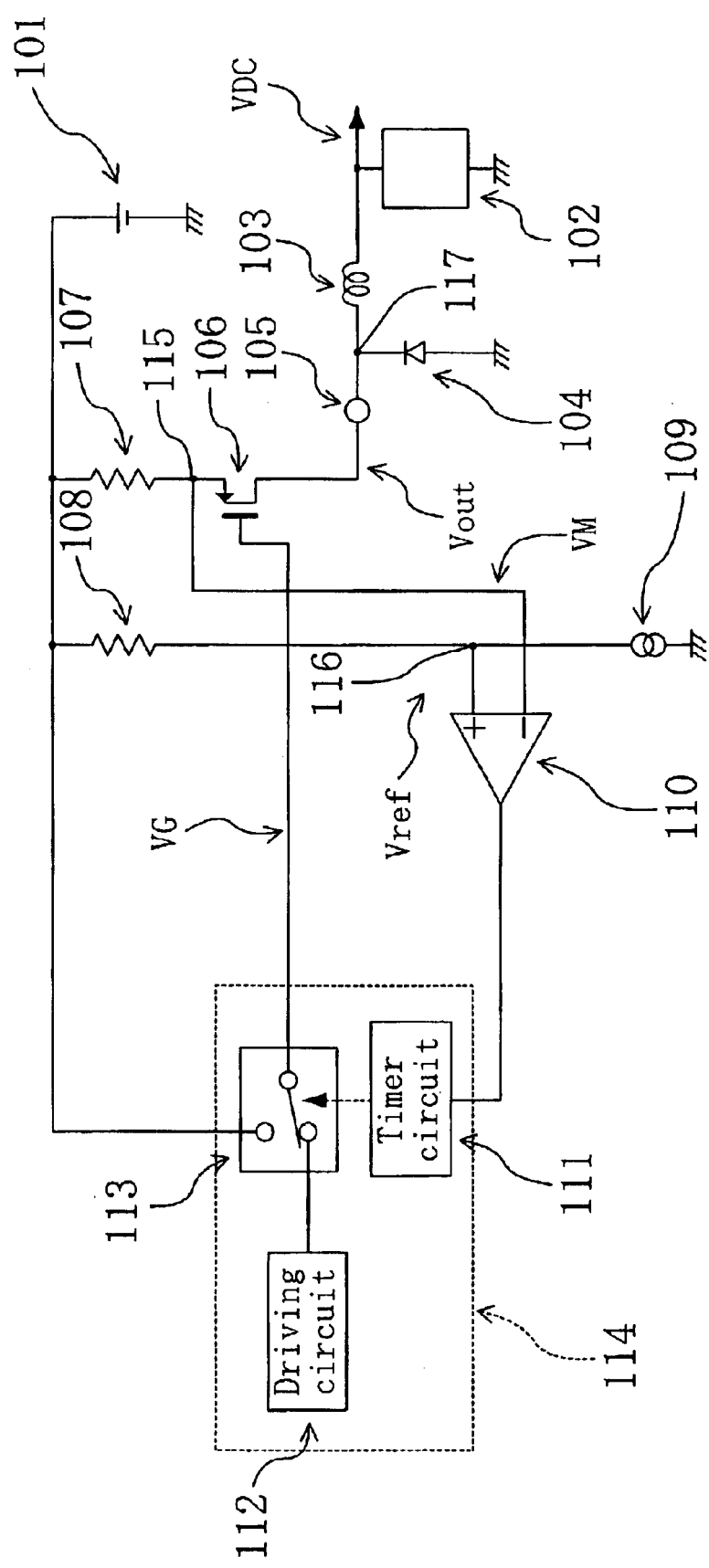
FIG. 11 is a circuit diagram showing the configuration of a conventional output circuit.
Figure 12A:
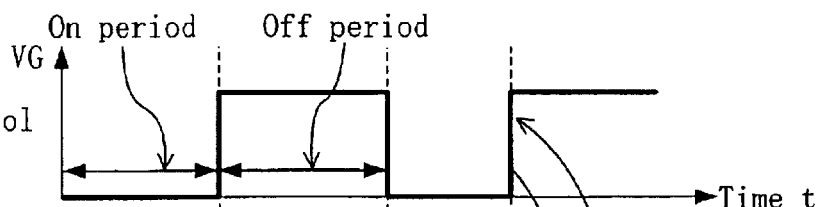
FIGS. 12(a) through 12(e) are timing charts each showing the waveform of voltage or current of each component provided in the conventional output circuit.
Figure 12B:
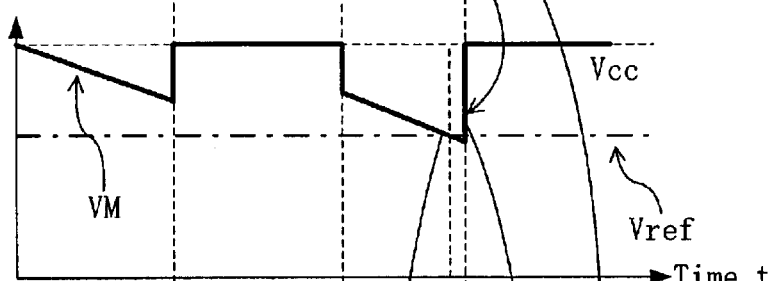
Figure 12C:
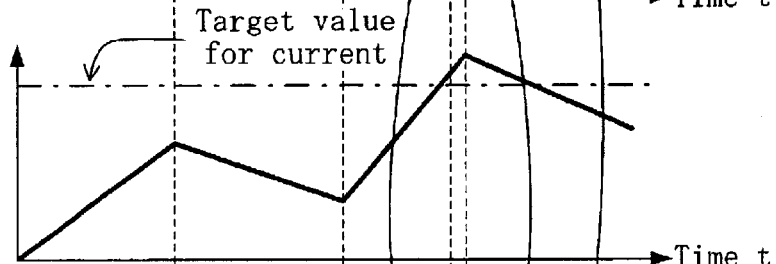
Figure 12D:
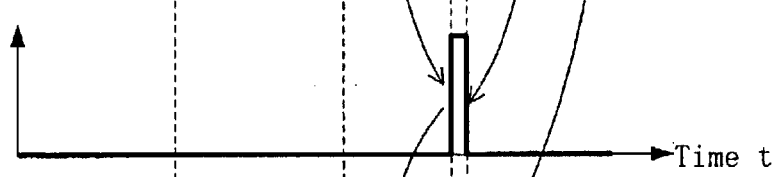
Figure 12E:
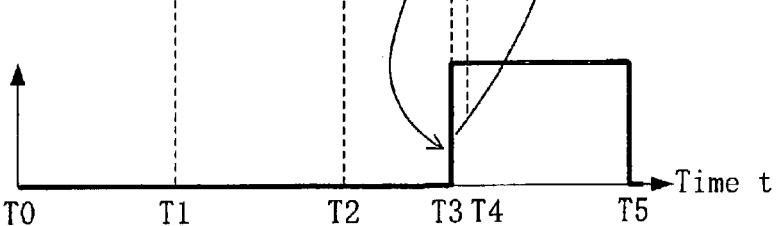

FIG. 9 shows the configuration of the output circuit of the fifth embodiment in which n-channel MIS transistors are used. As shown in FIG. 9, if output and reference MIS transistors 6 and 18 are each formed by an n-channel MIS transistor, the output circuit is provided with not only a main power supply unit 1 but also a second power supply unit 21 capable of supplying a voltage higher than that of the main power supply unit 1 as in the second embodiment. And the output from an output section (Q) of an SR flip-flop 31 is applied to a gate electrode of the output MIS transistor 6.

Although a single reference MIS transistor 18 is provided in the output circuit of this embodiment, a plurality of reference MIS transistors may be provided and connected to each other in series as in the third embodiment. In such an embodiment, the power consumption can be further reduced. In addition, since the electric characteristics of the output and reference MIS transistors can be made uniform, the output current can be accurately limited by defining the ratio between the output and reference MIS transistors.

Besides, although an SR flip-flop is used as the latch circuit for carrying out the ON/OFF control of the output MIS transistor 6, the present invention is not limited to this. Alternatively, a D flip-flop or a J-K flip-flop may be used as the latch circuit.

What is claimed is:

1. An output circuit comprising:

an output node through which power is supplied to an external load circuit;

a first power supply unit;

an output MIS transistor, provided between the first power supply unit and the output node, for allowing or stopping the supply of the power to the output node;

a current supply unit;

a reference node connected to the current supply unit;

a reference MIS transistor that is provided between the first power supply unit and the reference node, and that has a gate electrode to which a constant voltage is applied to allow the reference MIS transistor to function as a resistor;

a comparator having one input section thereof connected to the reference node and the other input section thereof connected to the output node; and a control circuit, connected to the output section of the comparator, for carrying out the ON/OFF control of the output MIS transistor so as to turn the output MIS transistor OFF for a given period of time at least when the potential of the output node is lower than that of the reference node.

2. The output circuit of claim 1, wherein no resistor used for the monitoring of an output current outputted from the output node is provided between the first power supply unit and the output MIS transistor.

3. The output circuit of claim 1, wherein each of the output and reference MIS transistors is a p-channel MIS transistor having a gate electrode.

4. The output circuit of claim 1, wherein the control circuit comprises:

a driving circuit that is operated by the power supplied from the first power supply unit; and a switching circuit for carrying out, in response to an output signal from the comparator, a switching operation to block an output signal from the driving circuit or to allow an output signal from the driving circuit to be inputted to a gate electrode of the output MIS transistor.

5. The output circuit of claim 4, wherein when the potential of the output node is higher than that of the reference node, the switching circuit carries out a switching operation to allow an output signal from the driving circuit to be inputted to the gate electrode of the output MIS transistor, and when the potential of the output node is lower than that of the reference node, the switching circuit carries out a switching operation to allow a voltage of the first power supply unit to be applied to the gate electrode of the output MIS transistor for a given period of time.

6. The output circuit of claim 3, wherein the control circuit comprises:

a pulse generator; and a latch circuit that is reset in response to an output signal from the comparator, and that is set in response to an output signal from the pulse generator, and wherein the output MIS transistor is controlled to turn ON/OFF in response to an output signal from the latch circuit.

7. The output circuit of claim 6, wherein the latch circuit is an SR flip-flop.

8. The output circuit of claim 1, wherein each of the output and reference MIS transistors is an n-channel MIS transistor having a gate electrode, and wherein the output circuit further comprises a second power supply unit for applying a voltage higher than that of the first power supply unit to at least the gate electrode of the reference MIS transistor.

9. The output circuit of claim 8, wherein the second power supply unit comprises a booster circuit.

10. The output circuit of claim 9, wherein the booster circuit is a bootstrap circuit or a charge pump circuit.

11. The output circuit of claim 8, wherein the control circuit comprises:

a driving circuit that is operated by the power supplied from the second power supply unit; and a switching circuit for carrying out, in response to an output signal from the comparator, a switching operation to block an output signal from the driving circuit or to allow an output signal from the driving circuit to be inputted to the gate electrode of the output MIS transistor.

12. The output circuit of claim 11, wherein when the potential of the output node is lower than that of the reference node, a ground potential is applied to the gate electrode of the output MIS transistor for a given period of time.

13. The output circuit of claim 8, wherein the control circuit comprises:

a pulse generator; and a latch circuit that is reset in response to an output signal from the comparator, and that is set in response to an output signal from the pulse generator, and wherein the output MIS transistor is controlled to turn ON/OFF in response to an output signal from the latch circuit.

14. The output circuit of claim 13, wherein the latch circuit is an SR flip-flop.

15. The output circuit of claim 1, wherein a plurality of the reference MIS transistors are provided and connected to each other in series.

16. The output circuit of claim 1, wherein both the output MIS transistor and the reference MIS transistor are integrated on a single chip.

17. An output circuit comprising:

an output node through which power is supplied to an external load circuit;

a first power supply unit;

an output MIS transistor, provided between the first power supply unit and the output node, for allowing or stopping the supply of the power to the output node;

a current supply unit;

a reference node connected to the current supply unit;

a reference MIS transistor that is provided between the first power supply unit and the reference node, and that has a gate electrode to which a constant voltage is applied to allow the reference MIS transistor to function as a resistor;

a comparator having one input section thereof connected to the reference node and the other input section thereof connected to the output node; and a control circuit, connected to the output section of the comparator, for carrying out the ON/OFF control of the output MIS transistor so as to turn the output MIS transistor OFF for a given period of time at least when the potential of the output node is lower than that of the reference node, wherein both the output MIS transistor and the reference MIS transistor are integrated on a single chip.

18. The output circuit of claim 17, wherein the gate width of the output MIS transistor is larger than that of the reference MIS transistor.

19. The output circuit of claim 17, further comprising a second power supply unit for supplying a voltage higher than that of the first power supply unit to the gate electrode of the reference MIS transistor.

* * * * *